(12) United States Patent
Feng et al.

(10) Patent No.: US 7,269,778 B1
(45) Date of Patent: Sep. 11, 2007

(54) DATA CODING FOR ENFORCING CONSTRAINTS ON ONES AND ZEROS IN A COMMUNICATIONS CHANNEL

(75) Inventors: Weishi Feng, San Jose, CA (US); Pantas Sutardja, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 599 days.

(21) Appl. No.: 10/423,552

(22) Filed: Apr. 25, 2003

Related U.S. Application Data

(60) Provisional application No. 60/422,061, filed on Oct. 28, 2002, provisional application No. 60/419,732, filed on Oct. 18, 2002, provisional application No. 60/419,289, filed on Oct. 17, 2002, provisional application No. 60/418,552, filed on Oct. 15, 2002.

(51) Int. Cl.
*H03M 13/00* (2006.01)
(52) U.S. Cl. ......................................... 714/758; 341/59
(58) Field of Classification Search ................... 341/59
See application file for complete search history.

(56) References Cited

U.S. PATENT DOCUMENTS

| | | | |
|---|---|---|---|
| 5,377,265 A | 12/1994 | Wettengel et al. | |
| 5,712,863 A | 1/1998 | Gray | |
| 5,815,514 A | 9/1998 | Gray | |
| 5,898,394 A * | 4/1999 | Kobayashi et al. | 341/58 |
| 5,931,968 A | 8/1999 | Gray | |
| 6,177,890 B1 * | 1/2001 | Keirn et al. | 341/59 |
| 6,260,171 B1 | 7/2001 | Gray | |
| 6,308,295 B1 | 10/2001 | Sridharan et al. | |
| 6,363,512 B2 | 3/2002 | Gray | |
| 6,438,724 B1 | 8/2002 | Cox et al. | |
| 6,513,139 B2 | 1/2003 | Gray | |
| 6,557,136 B1 * | 4/2003 | Friedmann | 714/752 |
| 6,631,490 B2 * | 10/2003 | Shimoda | 714/755 |
| 6,897,792 B1 * | 5/2005 | Feng | 341/59 |
| 7,006,016 B1 * | 2/2006 | Feng | 341/58 |
| 2002/0044767 A1 | 4/2002 | Kwak | |
| 2002/0049949 A1 | 4/2002 | Shimoda | |

* cited by examiner

*Primary Examiner*—Albert Decady
*Assistant Examiner*—Sam Rizk

(57) ABSTRACT

A communications channel such as a data storage system removes unwanted bit patterns from user data without using run length limited coding on the user data. A buffer receives the user data. A data dependent scrambler communicates with the buffer and selects one of a plurality of scrambling sequences based the user data stored in the buffer or generates a scrambling sequence based on the user data stored in the buffer. A scrambling device communicates with the data dependent scrambler and scrambles the user data stored in the buffer with the selected scrambling sequence from the data dependent scrambler.

84 Claims, 15 Drawing Sheets

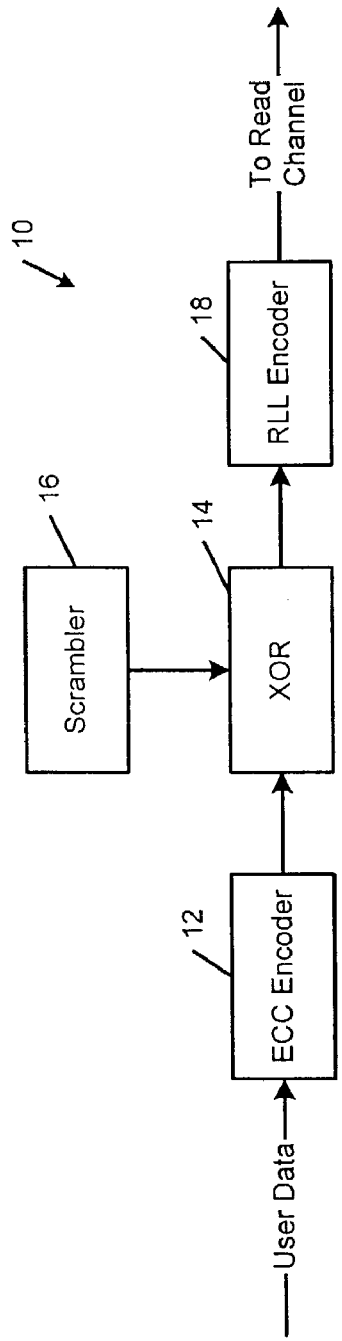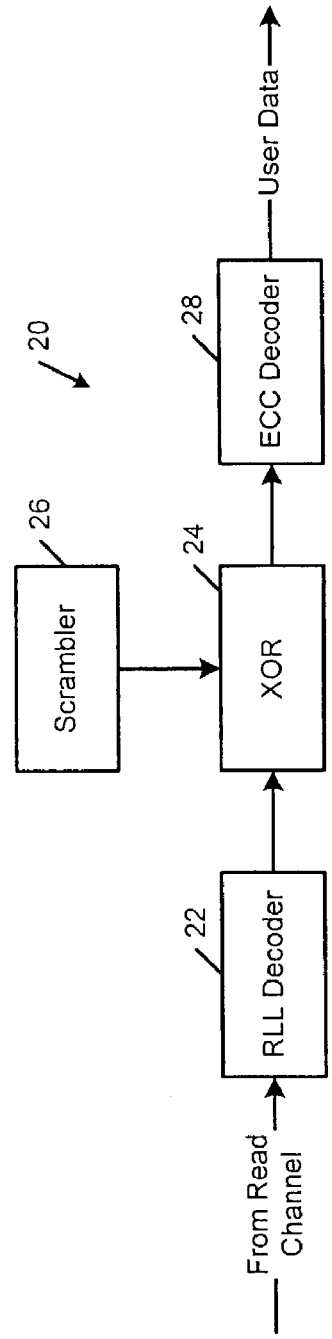

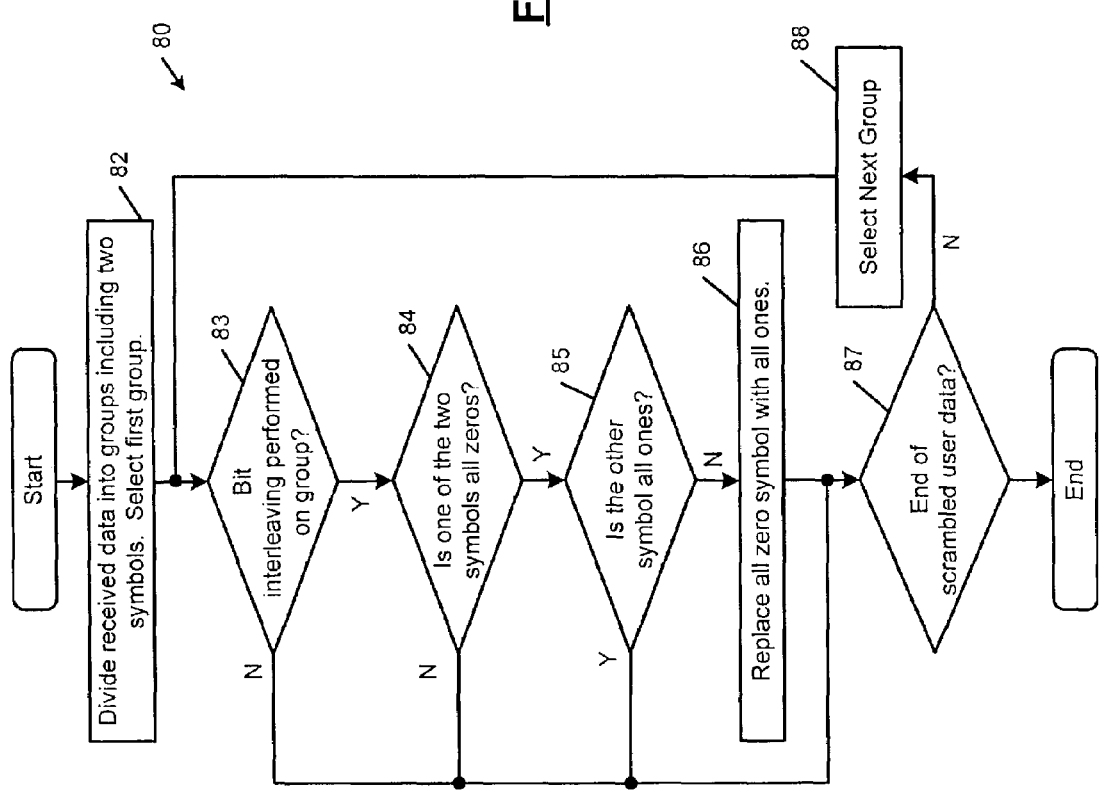

DATA CODING FOR ENFORCING CONSTRAINTS ON ONES AND ZEROS IN A COMMUNICATIONS CHANNEL

This application claims the benefit of U.S. Provisional Application Nos. 60/418,552, filed on Oct. 15, 2002, 60/419,289, filed on Oct. 17, 2002, 60/419,732 filed on 18 Oct. 2002 and 60/422,061, filed on Oct. 28, 2002, which are incorporated herein by reference in their entirety.

FIELD OF THE INVENTION

The present invention relates to data coding in a communications channel, and more particularly to data coding that reduces unwanted bits patterns in a communications channel.

BACKGROUND OF THE INVENTION

Magnetic storage systems such as disk drives include a magnetic medium or platter with a magnetic coating that is divided into data tracks. The data tracks are divided into data sectors that store fixed-sized data blocks. A read/write head typically includes a write circuit and write element such as an inductor that selectively generate positive and negative magnetic fields that are stored by the magnetic medium. The stored positive and negative fields represent binary ones and zeros. The read/write head includes an element such as a magneto-resistive element that senses the stored magnetic field to read data from the magnetic medium. A spindle motor rotates the platter and an actuator arm positions the read/write head relative to the magnetic medium.

Magnetic storage systems typically code the user data using Run Length Limited (RLL) code. RLL coding reduces sequences in the user data that may cause problems with timing circuits of the magnetic storage system. For example, a RLL code enforces constraints on the number of consecutive ones and/or zeros that are allowed to occur in the data. The efficiency of the RLL code is typically measured in terms of a code rate. For every m-bits or m-bytes of user data, an n-bit or n-byte encoded word is written to the storage media. RLL codes are used to eliminate bad patterns in the original data and typically do not have error correction capability.

Referring now to FIG. 1, a write path 10 in a conventional data storage system includes an error correction coding (ECC) encoder (ENC) 12 that receives user data. The ECC ENC 12 generates cyclic redundancy check (CRC) and/or ECC bits that are appended to the user data. The user data, CRC bits and/or ECC bits are output by the ECC ENC 12 to an input of an XOR gate 14. Another input of the XOR gate 14 receives an output of a data scrambler 16, which generates a pseudo-random binary sequence.

A scrambled output of the XOR gate 14 is input to a run length limited (RLL) ENC 18. The RLL ENC 18 encodes bit stings to prevent the unwanted bit patterns that violate the constraint and outputs a bit stream to a read channel (R/C). The RLL ENC 18 typically converts a block of $N_{RLL}$ bits into ($N_{RLL}$+1) bits to avoid the unwanted data patterns.

In FIG. 2, a read path 20 of a data storage system is shown. The read path 20 includes a RLL decoder (DEC) 22 that receives the bit stream from the read channel and decodes the bit stream. An output of the RLL DEC 22 is input to an XOR gate 24. A scrambler 26, which is the same as the scrambler 16, generates the pseudo-random binary sequence, which is input to another input of the XOR gate 24. An output of the XOR gate 24 is input to an ECC DEC 26, which performs ECC decoding and outputs the user data. The RLL ENC 18 eliminates unwanted data patterns. However, the RLL ENC 18 also reduces data storage capacity. In other words, RLL coding increases channel bit density (CBD), which reduces SNR and leads to lower reliability.

SUMMARY OF THE INVENTION

A communications channel that removes unwanted bit patterns from user data includes a buffer that receives the user data that includes a plurality of m-bit symbols. A data dependent scrambler communicates with the buffer, searches for a first m-bit symbol that is non-zero and that is different than the plurality of m-bit symbols in the user data and/or inverses of the plurality of m-bit symbols. The first m-bit symbol is a seed of the scrambling sequence. The data dependent scrambler generates a scrambling sequence by repeating the seed. A scrambling device communicates with the data dependent scrambler and scrambles the user data stored in the buffer using the selected scrambling sequence.

In still other features, the communications channel is a data storage system including a write path and a read path. A second coding device is located in the write path and removes runs of zeros in interleaved subsequences in the scrambled user data. The second coding device includes a first divider that separates the scrambled user data into at least one group including first and second symbols each with first and second interleaved subsequences. A symbol interleaver communicates with the first divider and interleaves the first and second symbols when the first interleaved subsequences of the first and second symbols are all zeros or the second interleaved subsequences of the first and second symbols are all zeros.

In still other features, a first decoder is located in the read path and includes a second divider that separates the scrambled user data into at least one group including first and second symbols. A symbol deinterleaver communicates with the second divider and deinterleaves the first and second symbols of the group when at least one of first and second symbols are all zeros.

In other features, a third coding device on the write path determines when one of the first and second symbols after interleaving is all zeros and the other of the first and second symbols is not all ones and replaces the all zero symbol with an all one symbol. A second decoding device on the read path determines when one of the first and second symbols is all ones and the other of the first and second symbols is not all zeros and replaces the all one symbol with all zeros and then performs bit deinterleaving.

In other features, the communications channel is a data storage system. An error correction coding (ECC) encoder generates ECC and CRC bits based on the scrambled user data and the seed and appends the ECC and CRC bits to the scrambled user data. A pattern eliminator communicates with the ECC encoder and eliminates unwanted bit patterns in the ECC and CRC bits.

In still other features, a first coding device receives the scrambled user data from the scrambling device. The first coding device includes a segmenter that segments the scrambled user data into Q segments. A counter communicates with the segmenter and counts a number of ones in each of the Q segments. An inverter communicates with the counter and inverts the segment if the number of ones in the segment is less than a predetermined number of ones and does not invert the segment if the number of ones is greater than or equal to the predetermined number of ones. An inverted segment indicator communicates with the inverter and appends inverted segment data to the segments.

In yet other features, the scrambling device performs bitwise XOR. The pattern eliminator includes a RLL encoder that encodes the ECC and the CRC bits.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 1 is a functional block diagram of a write path in a data storage system according to the prior art;

FIG. 2 is a functional block diagram of a read path in a data storage system according to the prior art;

FIG. 6 illustrates coding steps on the write path for reducing all one symbols when bit interleaving is used;

DETAILED DESCRIPTION OF THE PREFERRED EMBODIMENTS

Figure 3A:
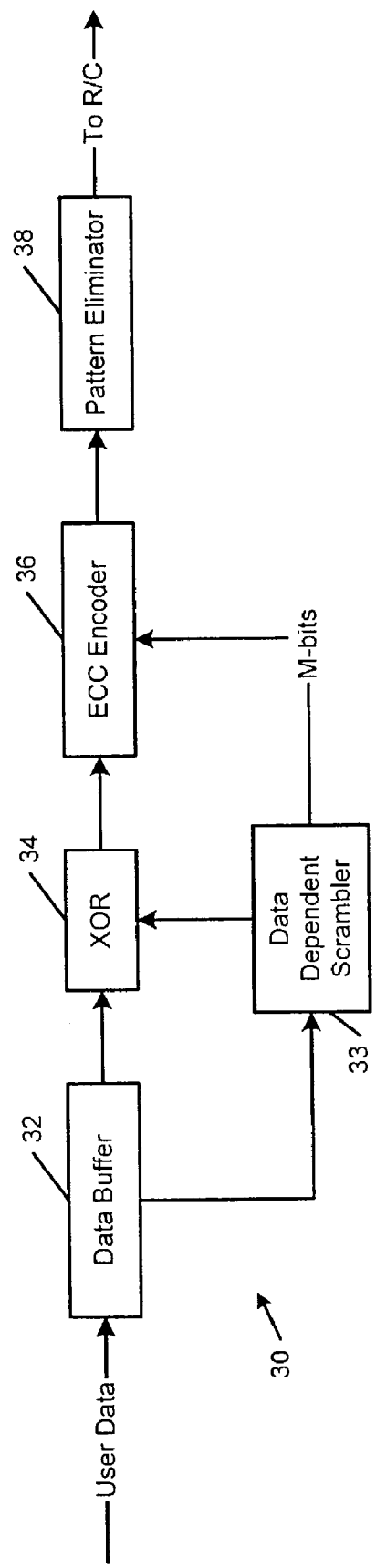
FIG. 3A illustrates a write path of a data storage system including a first data dependent scrambler according to the present invention.

The following description of the preferred embodiment(s) is merely exemplary in nature and is in no way intended to limit the invention, its application, or uses. For purposes of clarity, the same reference numbers will be used in the drawings to identify the same elements.

While the present invention will be described in the context of a data storage system, skilled artisans will appreciate that the present invention can be applied to any communications channel with constraints on the number of consecutive ones or zeros. As will be described further below, the data storage system according to the present invention does not employ RLL coding on a user data portion. The present invention discloses a coding technique that eliminates unwanted bit patterns with a smaller reduction in data storage capacity as compared to RLL coding. In other words, the coding technique according to the present invention reduces the channel bit density (CBD) less than data storage systems using RLL coding on the user data. As used herein, the term data dependent scrambler is defined as a scrambler that alters at least one of a selected scrambler, a generating polynomial, a seed, and a scrambling sequence based upon current user data that is to be scrambled.

Referring now to FIG. 3A, a write path 30 according to the present invention is shown for a data storage system. User data is input to a data buffer 32. A data dependent scrambling device 33 according to the invention searches for a suitable scrambling sequence based on the user data stored in the buffer and outputs the selected scrambling sequence to an input of XOR gate 34. The term data buffer as used herein is defined as any device that stores the data while the data dependent scrambling device identifies the scrambling sequence, scrambler, polynomial, and/or seed that will be used to scramble the user data. The scrambling sequence is data dependent in that it depends on the user data portion on the data buffer 32 as will be described below.

A delayed output of the data buffer 32 is also output to the XOR gate 34 when the scrambling sequence is found. The delay of the data buffer 32 should be sufficient to allow the scrambling sequence to be generated by the data dependent scrambler 33. An output of the XOR gate 34 and overhead bits that are output by the scrambler 33 are input to an ECC ENC 36, which appends the scrambler overhead bits to the scrambled user data. The ECC ENC 36 generates ECC and/or CRC bits based on the scrambled user data and/or the overhead bits. An output of the ECC encoder 36 is input to an optional pattern eliminator 38, which reduces remaining unwanted bit patterns (if any exist) and which will be described further below.

The data dependent scrambler 33 according to the present invention guarantees that the scrambled user data sequence will have a maximal length of a run of 0's that is less than $2*(m-1)$, where m is the symbol size. As used herein, the term symbol is defined as a group of bits. The scrambler 33 has symbol size m such that $(2^m-1)>k$, where k is the number of data symbols. Note that there are $(2^m-1)$ nonzero symbols. There are at least $(2^m-1-k)$ nonzero symbols, hereinafter a, that are different from any symbol in the user data.

Repeating the non-zero symbol a by k times gives a scrambling sequence (a, a, . . . , a). There are $(2^m-1-k)$ different scrambling sequences. Since $a$ is different from any symbol in the user data, every symbol in the scrambled user data is nonzero, assuming that the scrambling involves bitwise XOR. The symbol a is the seed of the scrambling sequence. The maximal length of a run of 0's is $2*(m-1)$. For example, a worst case for two adjacent symbols for a 10-bit symbol would be symbol1=1000000000 followed by symbol2=0000000001. In this case, only m-bit overhead is needed.

Figure 3B:
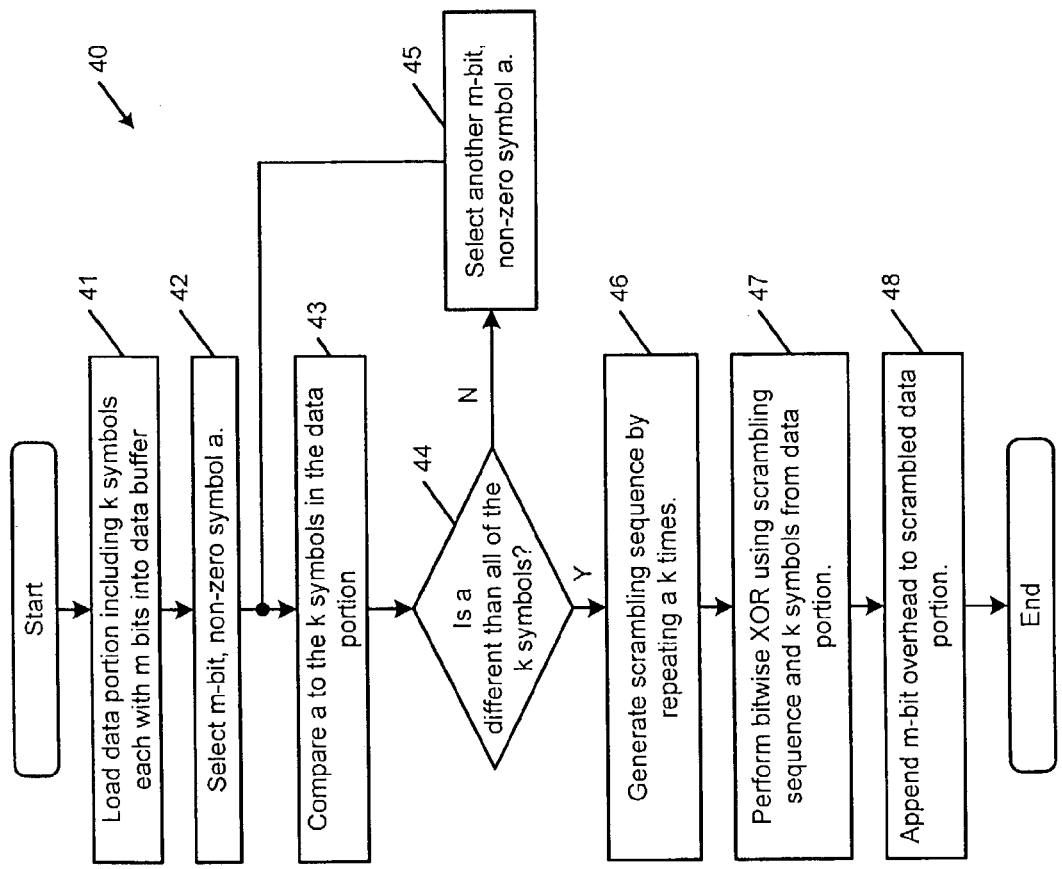
FIG. 3B is a flowchart illustrating steps that are performed by the first data dependent scrambler and write path in FIG. 3A.

Referring now to FIG. 3B, steps for operating the data dependent scrambler 33 are shown generally at 40. In particular, a data portion including k symbols each with m bits is loaded into the data buffer 32 in step 41. In steps 42-45, an exemplary method for finding non-zero symbols a that are not equal to any of the k symbols is shown.

In step 42, an m-bit, non-zero symbol a is selected. In step 43, a is compared to the k symbols that are stored in the data buffer. In step 44, if a is not different than all of the k symbols, another m-bit, non-zero symbol a is selected in step 45 and control continues with step 43. Otherwise, if a is different that all of the k symbols, control continues with step 46 and a scrambling sequence is generated by repeating symbol a k times. Once a is found, the bitwise XOR can begin. Alternately, a default worst case search time can be used. In step 47, bitwise XOR using the scrambling sequence and the k symbols is performed to generate a scrambled data portion. In step 48, the m-bit overhead is appended to the scrambled data portion either before or after ECC encoding is performed.

Note that the proposed method can also prevent long run of 1's. While searching for the scrambling sequence (a, a, . . . a), the search is modified to locate symbols a such that a is different from any symbol and its (bitwise) inversion in the user data. The symbol size m is selected such that $(2^m-1)>2*k$. The searching complexity is increased, which may increase the delay somewhat. After the data has been scrambled using the modified scrambling sequence, there will be no all-zero symbol or all-one symbol. Therefore, the maximal length of a run of zeros or ones is $(2*m-2)$.

In some applications, unwanted patterns also include a long run of zeros in any of the two interleaved sub-sequences. For example, in the bit sequence $b_0$ $b_1$ $b_2$ $b_3$ $b_4$ $b_5$ $b_6$ $b_7$ $b_8$ $b_9$ . . . , there should be no long runs of 0's in either of a first interleaved sub-sequence $b_0$ $b_2$ $b_4$ $b_6$ $b_8$ . . . and a second interleaved sub-sequence $b_1$ $b_3$ $b_5$ $b_7$ $b_8$ ... Without further processing, the length of a run of 0's in one of the subsequences could be very long despite the fact that every symbol is nonzero.

This problem can be solved by dividing the scrambled user data into one or more groups including two symbols. For example for m=10, a group includes a first symbol =($b_0$ $b_1$ $b_2$ $b_3$ $b_4$ $b_5$ $b_6$ $b_7$ $b_8$ $b_9$) and a second symbol=($b_{10}$ $b_{11}$ $b_{12}$ $b_{13}$ $b_{14}$ $b_{15}$ $b_{16}$ $b_{17}$ $b_{18}$ $b_{19}$). Each symbol includes two interleaved subsequences. If one of the two subsequences in both the first and second symbols is all zero, then bit-interleaving is performed as follows: ($b_0$ $b_{10}$ $b_2$ $b_{12}$ $b_4$ $b_{14}$ $b_6$ $b_{16}$ $b_8$ $b_{18}$) and ($b_1$ $b_{11}$ $b_3$ $b_{13}$ $b_5$ $b_{15}$ $b_7$ $b_{17}$ $b_9$ $b_{19}$). One of the bit-interleaved symbols will be all zero. All of the symbols in the groups without bit-interleaving are nonzero by default. Therefore, when a zero symbol is encountered in one of the groups on the decoding side before de-scrambling, deinterleaving is used to recover the scrambled user data sequences in the group.

Figure 4B:
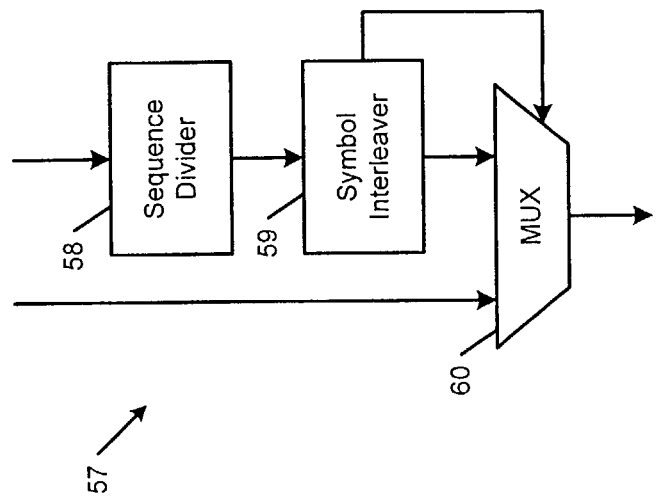
FIG. 4B is a functional block diagram of a coder that performs selective symbol interleaving in FIG. 4A.
Figure 4A:
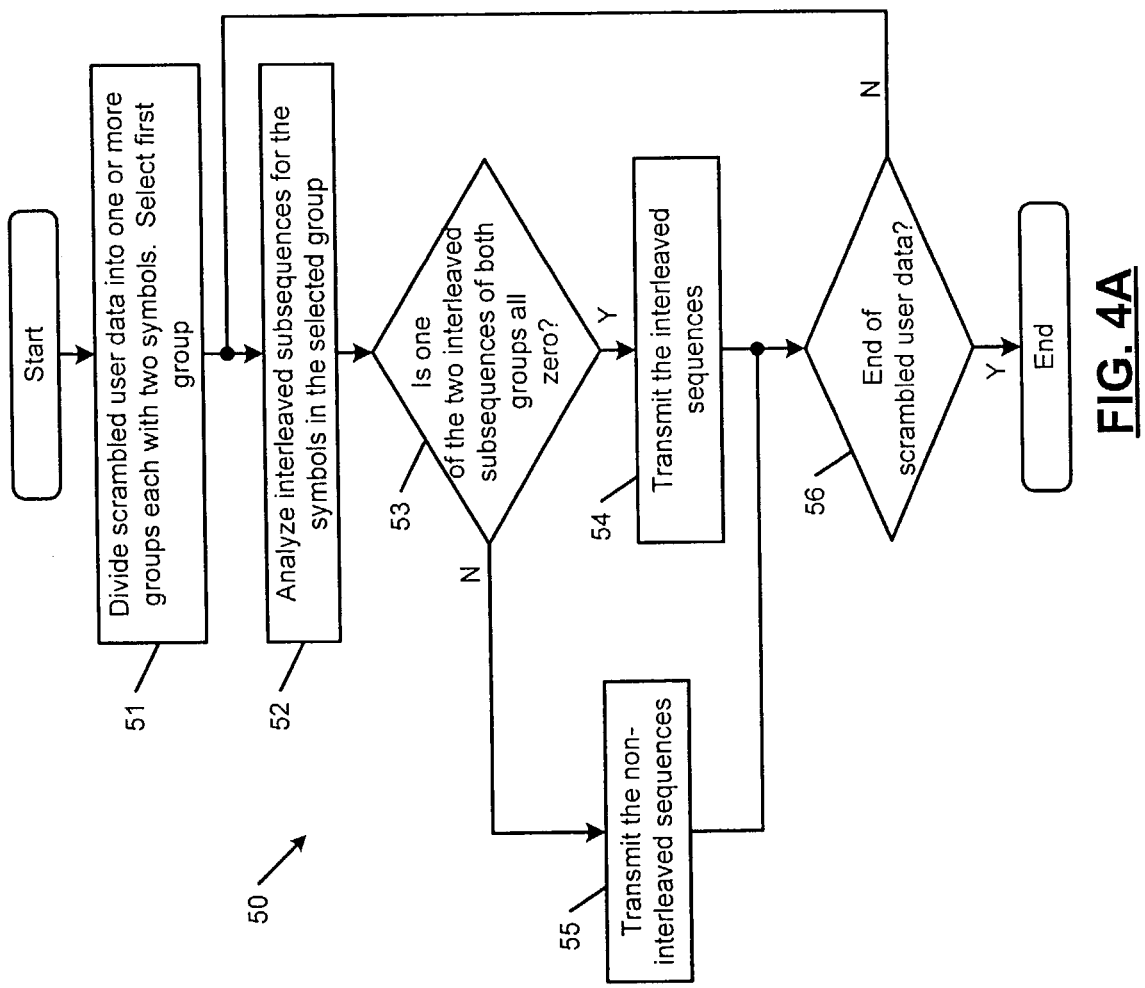
FIG. 4A illustrates coding steps on the write path for reducing unwanted bit patterns when interleaving is employed.

Referring now to FIG. 4A, steps for removing long runs of 0's from interleaved sequences is shown at generally at 50. In step 51, the data is divided into one or more groups each with one or more symbols. In step 52, interleaved subsequences for the symbols are analyzed. In step 53, if one of the two interleaved subsequences for both groups is all zero, the interleaved sequences are transmitted in step 54. Otherwise, the non-interleaved sequences are transmitted in step 55. If there are additional groups in the user data as determined in step 56, control continues with step 52. Otherwise, control ends.

In FIG. 4B, an exemplary selective encoder or P-code ENC 57 for performing the steps of FIG. 4A are shown. For example, the selective encoder 57 is positioned after the XOR 34 or the ECC ENC 36 in FIG. 3A. A sequence divider 58 divides the data into groups each having a first and second symbol. A symbol interleaver 59 checks for the conditions set forth in steps 52 and 53, interleaves the symbols and generates a select signal to a multiplexer 60 if the conditions are present. After the P-code ENC, the maximum number of consecutive zeros is 2*m, where m is the symbol size. The sequence having 2*m consecutive zeros is (all-one, all-zero, all-zero, all-one). The maximum number of consecutive zeros in any interleaved subsequence is $2*(m-1)$.

Figure 5B:
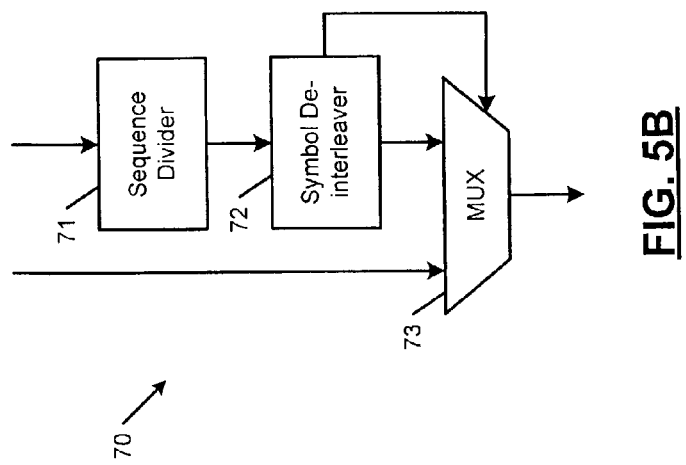
FIG. 5B is a functional block diagram of a decoder that performs the steps in FIG. 5A.
Figure 5A:
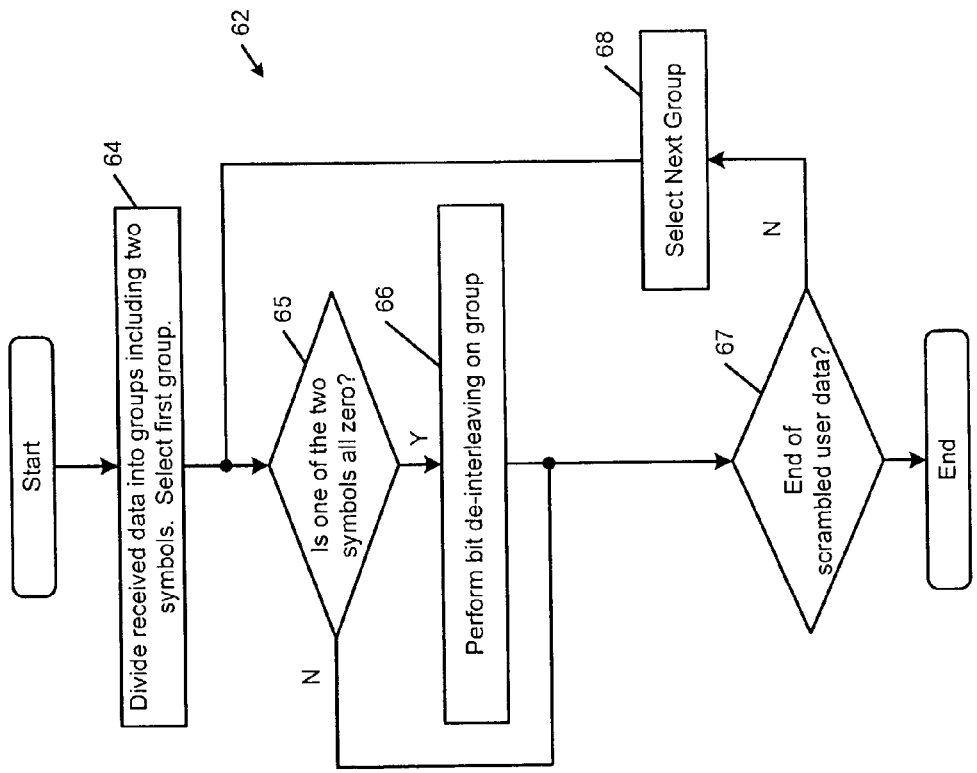
FIG. 5A illustrates decoding steps on the read path when the coding in FIG. 4A is used.

Referring now to FIG. 5A, decoding steps 62 are shown. The data is received and divided into groups in step 64. In step 65, control determines if one of the two symbols is all zero. If true, bit deinterleaving is performed on the symbols in step 66. If false, bit deinterleaving is not performed. If there is another group, as determined in step 67, the next group is selected in step 68 and control continues with step 65. Otherwise, control ends.

In FIG. 5B, an exemplary selective decoder or P-code DEC 70 for performing the steps of FIG. 5A are shown. A sequence divider 71 divides the data into groups each having a first and second symbol. A symbol deinterleaver 72 checks for the conditions set forth in steps 65, deinterleaves the symbols and generates a select signal to a multiplexer 73 if the conditions are present.

With the bit-interleaving technique described above, all-one symbols may also appear. However, an all-one symbol in a one group will either be preceded or followed by an all zero symbol. Therefore, the maximum length of a run of 1's is 2*m. Therefore, the scramblers according to the present invention can prevent long runs of both zeros and ones in the data sequence and the interleaved subsequences. An all-one symbol can be produced only after bit interleaving. As such, an all-one symbol should either be preceded or followed by an all-zero symbol. Now the longest run of zeros happens in the following scenario (m=10): 1100000000 0000000000 0000000000 0000000011.

If the two symbols in a group after bit-interleaving are one all-zero symbol and one all-one symbol, then do nothing. If after bit-interleaving, the symbol other than the all-zero symbol is not an all-one symbol, then replace the all-zero symbol by an all-one symbol. On the decoding side, if a group contains an all-zero symbol and an all-one symbol, then do deinterleaving only. If a group contains an all-one symbol and a non-zero symbol, then replace the all-one symbol by all-zero symbol, then do deinterleaving. The length of the longest run of 0's is 2* m.

If the number of consecutive 1's is a concern, then the following method can reduce the length of longest run of ones at the cost of increased length of longest run of zeros: If there are two consecutive all-zero symbols across the group boundary and neither of the other two symbols in the two groups is the all-one symbol and both bit $d_0$ and bit $d_1$ are zeros, then the two consecutive all-zero symbols are replaced by two all-one symbols. By doing so, the length of the longest run of zeros is $(3*m-2)$. The length of the longest run of ones is $(3* m-1)$.

Referring now to FIG. 6, steps that are performed on the write path to reduce all one symbols is shown generally at 80. The steps 80 shown in FIG. 19 are performed in addition to the steps in FIG. 4. In step 82, the received data is divided into groups, each having two symbols. If bit interleaving was performed on the group as determined in step 83, control continues with step 84. In step 84, control determines whether one of the two symbols is all zero. If true, control determines whether the other symbol is all ones in step 85. If true, control replaces the all zero symbol with all ones in step 86. Control continues from steps 84 if false, step 85 if true and step 86 with step 87 where control determines whether there are additional groups. If true, control selects the next group in step 88 and continues with step 83. Otherwise control ends. The P-code ENC of FIG. 4B can be used to implement these steps.

Figure 7:
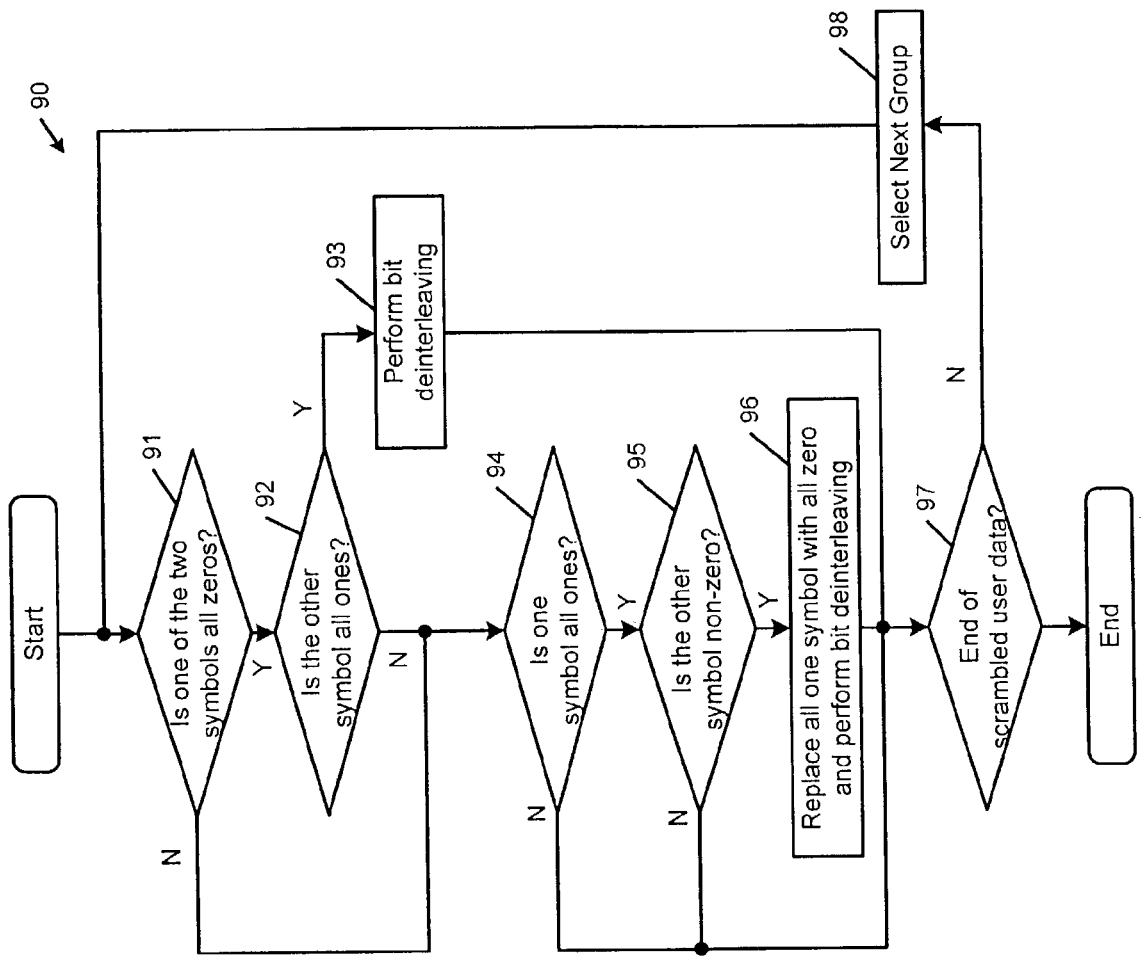
FIG. 7 illustrates decoding steps on the read path when the coding of FIG. 6 is used.

Referring now to FIG. 7, steps for decoding generally identified at 90 are shown. These steps are likewise performed in addition to the steps of FIG. 5. In step 91, control determines whether one of the two symbols is all zero. If true, control determines whether the other symbol is all ones in step 92. If true, bit deinterleaving is performed in step 93. If steps 91 and 92 are false, control determines whether one of the symbols is all ones. If true, control determines whether the other symbol is non-zero in step 95. If true, the all one symbol is replaced with all zeros and bit deinterleaving is performed in step 96. Control continues from steps 93 and 96 with step 97 where control determines whether there are additional groups in the user data. If true, the next group is selected in step 98 and control continues with step 91. The P-code DEC of FIG. 5B can be used to implement theses steps.

As can be appreciated, the data dependent scramblers, pattern eliminators, ECC coding/deconding and other structures that are described above can be implemented by application specific integrated circuits, dedicated circuits, software and a processor, discrete circuits and/or in any other suitable manner.

Figure 8:
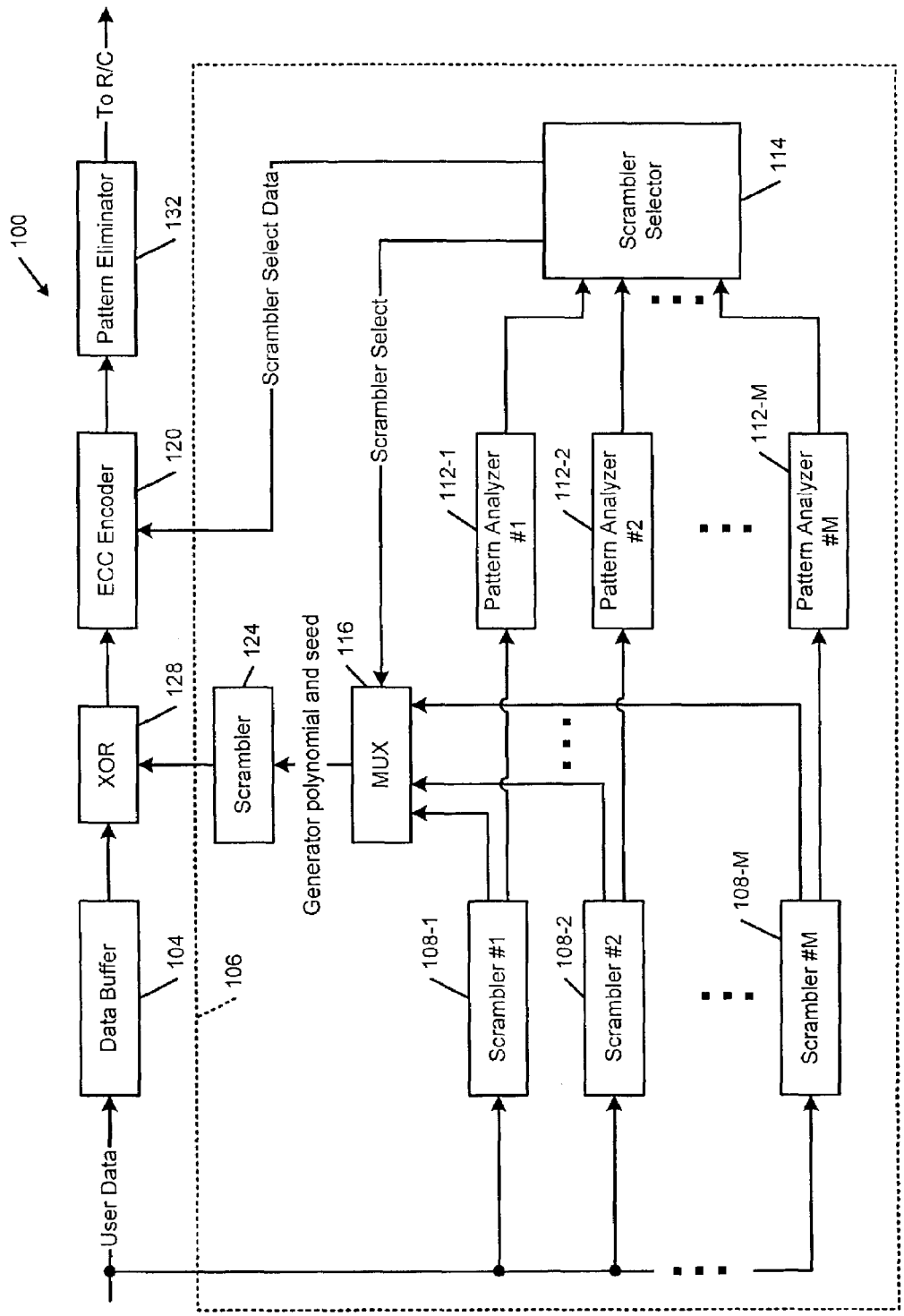
FIG. 8 illustrates a write path of a data storage system including a second data dependent scrambler according to the present invention.

Now we turn to several possible alternate configurations. Referring now to FIG. 8, a second data dependent scrambler according to the present invention for a write path 100 of a data storage system is shown. User data is input to a data buffer 104. A scrambling device 106 includes data dependent scramblers 108-1, 108-2, . . . , and 108-M that also receive the user data. Outputs of the scamblers 108-1, 108-2, . . . , and 108-M are input to corresponding pattern analyzers 112-1, 112-2, . . . , and 112-M and to a multiplexer 116. Outputs of the pattern analyzers 112-1,112-2, . . . , and 112-M are input to a scrambler selector 120, which selects one of the scramblers, as will be described further below. Scrambler selection data is also output by the scrambler selector 120 to an ECC ENC 120, which appends the scrambler selection data to the scrambled user data. The scramblers 108 preferably perform conventional scrambling using a polynomial and a seed.

The multiplexer 116 outputs a generator polynomial and a scrambler seed to a scrambler 124. The scrambler 124 uses the generator polynomial and the seed to generate a scrambler sequence that is input to XOR gate 128, which also receives the user data from the data buffer 104. Scrambled user data is output by the XOR gate 128 to the ECC ENC 120. The ECC ENC 120 generates CRC and/or ECC bits that are appended to the scrambled user data and output to an optional pattern eliminator 132, as will be described below.

According to the present invention, data scrambling is moved before the ECC ENC 120. The data buffer 104 is located before the data scrambling. While the data is transferred into and stored in the data buffer 104, the M scramblers 108 are running in parallel. Outputs of the scramblers 108 are monitored by the M pattern analyzers 112. Each pattern analyzer 112 determines the relative suitability of the scrambled data relative to predetermined constraints. In a preferred embodiment, the pattern analyzer 112 assigns a weight to each unwanted bit pattern sequence, accumulates unwanted bit pattern weights, and outputs a sum of the unwanted bit pattern weights. After comparing the output of all the pattern analyzers 112, the selector 120 chooses the scrambler 108 that produces the best pattern statistics and/or the least unwanted bit pattern statistics.

The selector 120 directs the final scrambling block to use the selected scrambling polynomial and seed. Scrambler select data is also appended to the scrambled user data. For M-parallel scramblers 108, approximately $\log_2(M)$ bits of information is added. As can be appreciated, the overhead is much smaller than the RLL coding approach. Using the approach shown in FIG. 4 and assuming random data, the probability of seeing at least one run of at least 22 zeros in 4096 bits (512 bytes) is $(4096-21)/2^{22}=1\ e^{-3}$.

Given M well designed scramblers 108, each scrambling sequence is considered independent. The probability that all of the M scrambled data sequences will contain at least one run of at least 22 zeros is $10^{-3M}$. This probability is $10^{-24}$ if M=8 and $10^{-48}$ if M=16. For the scrambled user data portion (excluding the CRC and the ECC), the scrambled user data from the selected scrambler will probably not contain any unwanted patterns.

Figure 9:
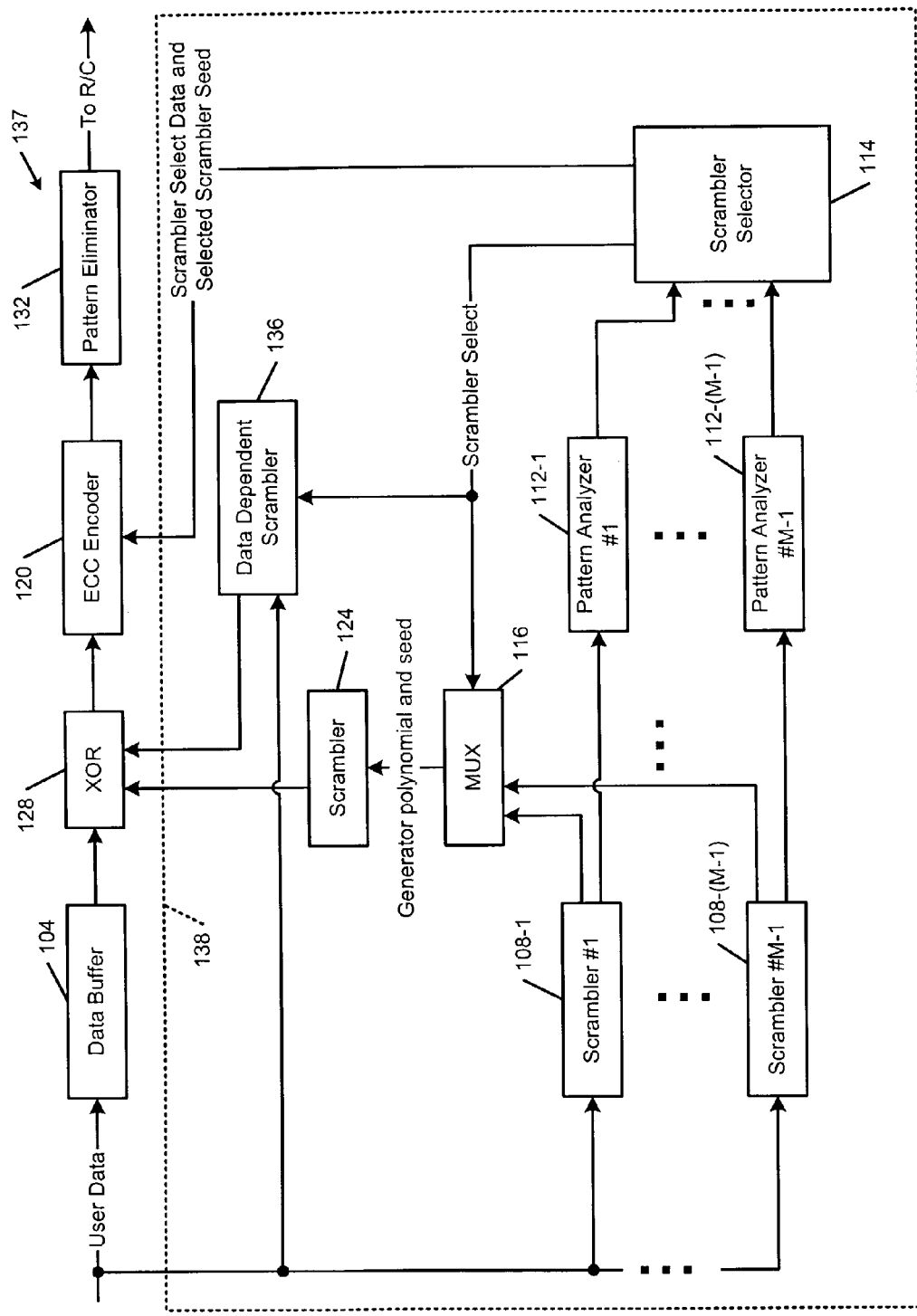
FIG. 9 illustrates a write path of a data storage system including a third data dependent scrambler according to the present invention.

Referring now to FIG. 9, a write path 137 includes a third data dependent scrambler device 138 including both conventional scramblers 108 and one or more scramblers 136 that are described in conduction with FIGS. 3A and 3B. In one embodiment, M-1 scamblers 108 and the scrambler 136 are provided. In this case, the scrambler selector 114 selects one of the M-1 scramblers if the accumulated unwanted bit pattern weight is less than a predetermined performance threshold. If not, the scrambler selector 114 (or the MUX 116) selects the scrambler 136. The scrambler selector 114 outputs scrambler select data ($\log_2$ (M) bits) and the seed of the selected scrambler to the ECC ENC 120. The scrambler 136 is used to guarantee a worst-case performance.

Figure 10A:
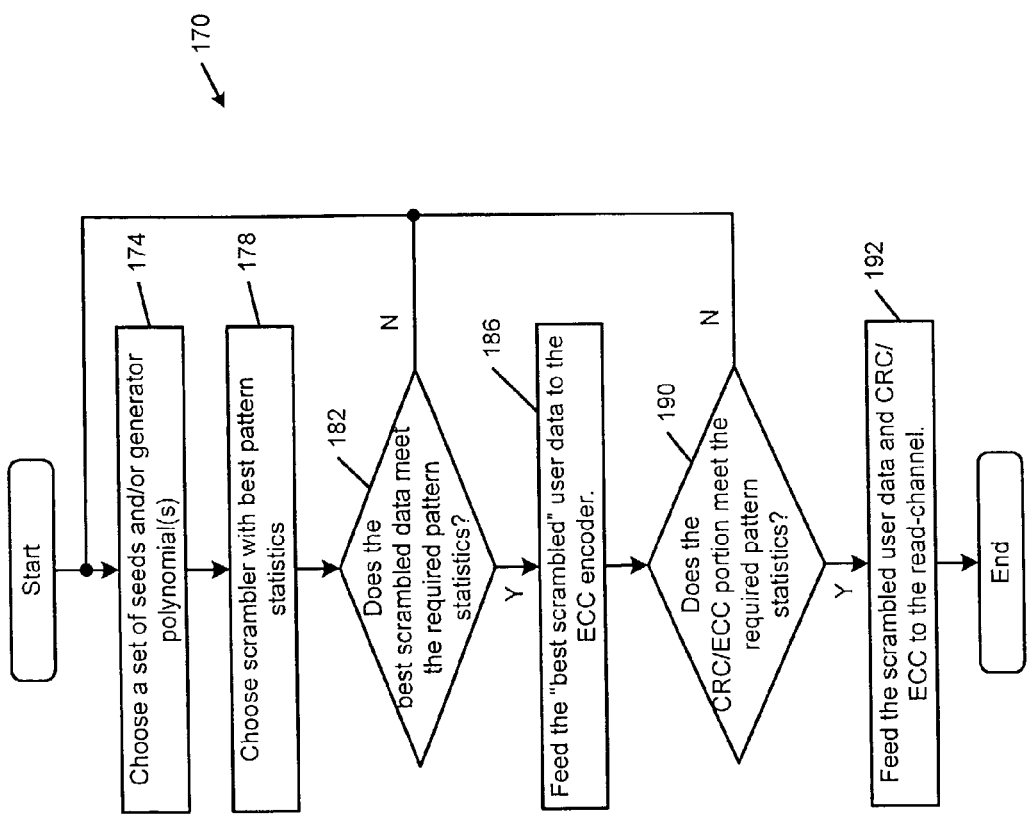
FIGS. 10A and 10B illustrate steps of first and second methods for performing retry when the resulting bit pattern is still unacceptable.

Referring now to FIG. 10A, steps for operating the scramblers using a retry process according to the present invention are shown generally at 170. In step 174, a set of seeds and/or generator polynomials are selected. In step 178, the scrambler with the best pattern statistics is selected. If the best scrambled pattern meets the required pattern statistics as determined in step 182, the best scrambled user data is fed to the ECC encoder in step 186. If step 182 is false, then the method continues with step 174. Continuing with step 186, if the CRC/ECC portion meets the required pattern statistics as determined in step 187, then the scrambled user data and CRC/ECC are output to the read channel in step 188. Otherwise, control loops to step 174.

There are several different options for coding the user data and user data section uses NRZ or INRZI code and the ECC section uses INRZI code. The user data section goes through the scrambler selection to minimize unwanted bit patterns. Therefore, there is less concern about long quasi-catastrophic sequences associated with NRZ coding. The ECC section cannot be scrambled. If no retry is performed when an unwanted ECC bit pattern is present, the ECC section is encoded using INRZI format. If retry is invoked upon the detection of an unwanted bit pattern in the ECC segment, then NRZ coding is still a good choice for the ECC section.

Figure 10B:
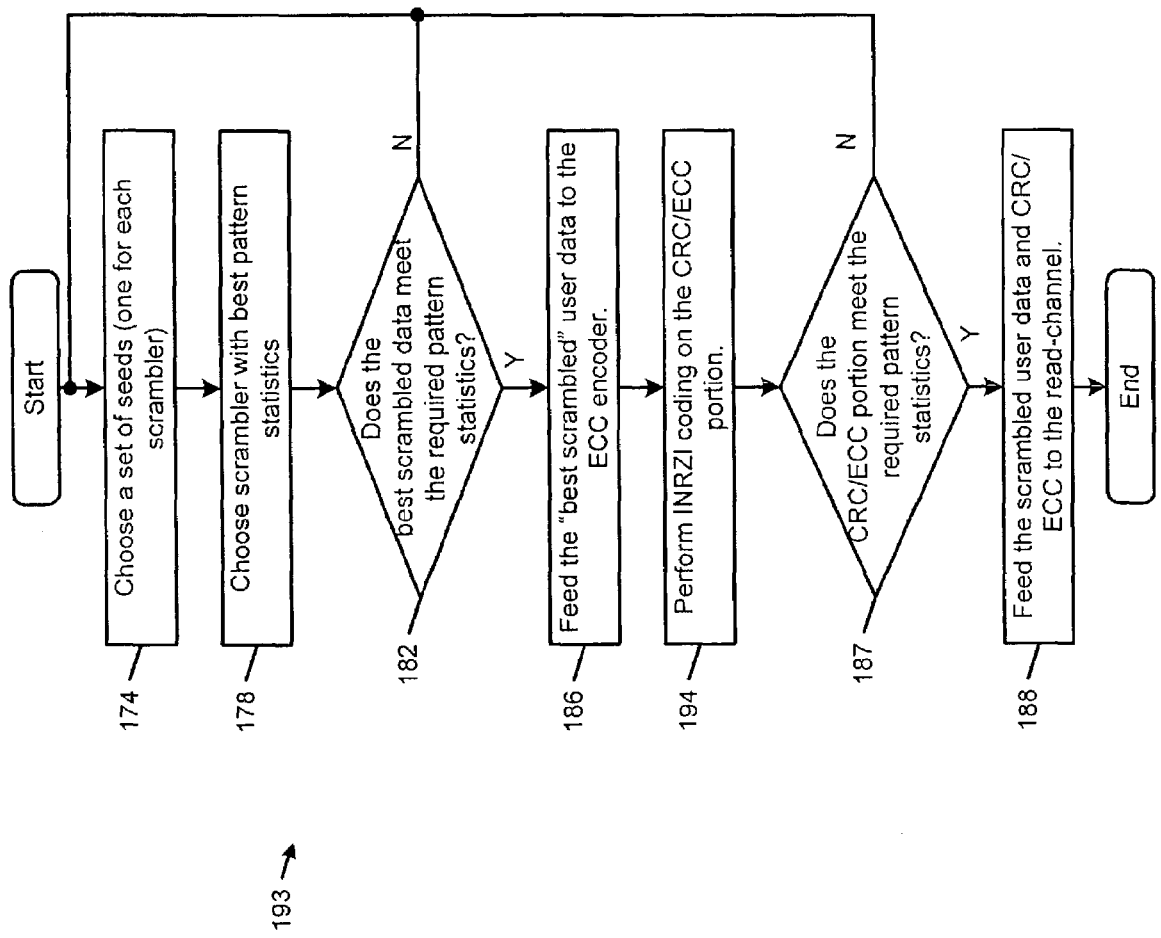

Referring now to FIG. 10B, many of the steps are the same as those shown in FIG. 10A. In FIG. 10B, steps for operating the scramblers using a retry process according to the present invention are shown generally at 193. However, after step 186, INRZI coding is performed on the CRC/ECC portion in step 194.

Figure 11:
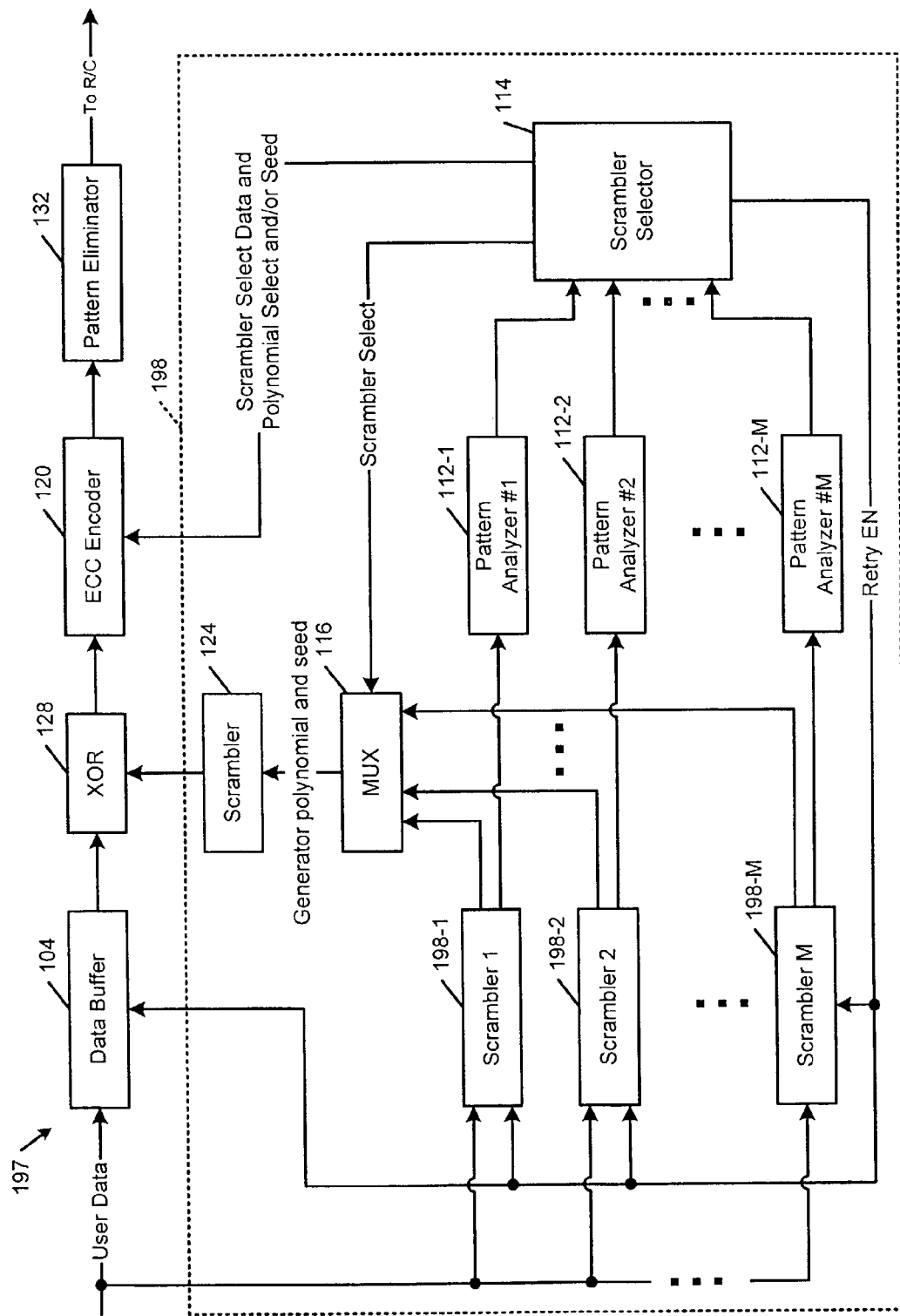
FIG. 11 illustrates a write path of a data storage system including a fourth data dependent scrambler with retry according to the present invention.

Referring now to FIG. 11, a write path 197 includes a data dependent scrambler device 198 with scramblers 198-1, 198-2, . . . , and 198-M that employ a retry process if bad patterns are not eliminated after coding. When retry is requested, the scramblers 198 change the polynomial generator and/or the seed. If the polynomial generator and/or the seed vary, selector information includes a polynomial selector and/or a seed selector.

Figure 12:
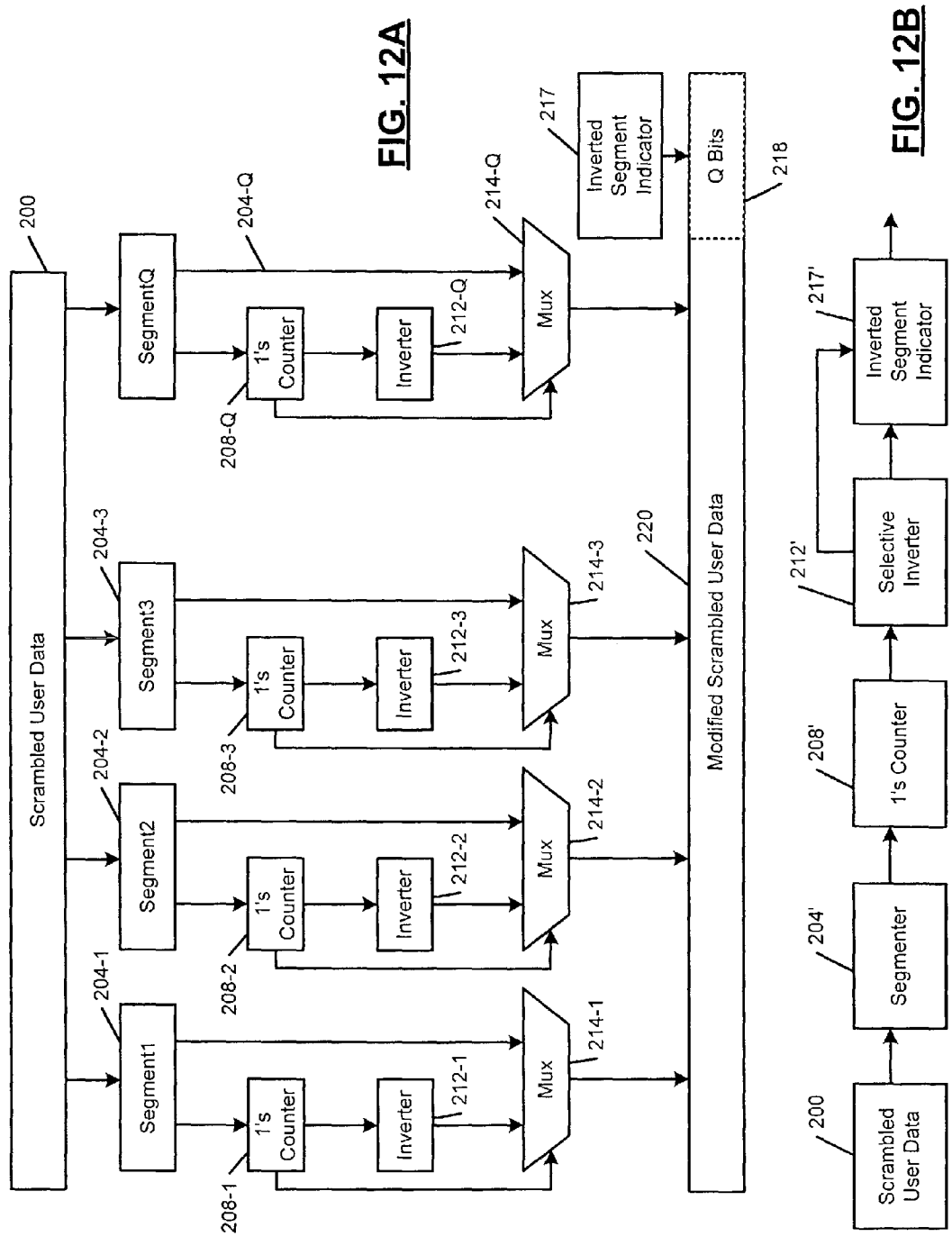
FIGS. 12A and 12B illustrate parallel and serial devices for reducing unwanted bit patterns when interleaved nonreturn to zero inverted (INRZI) coding is employed.

Referring now to FIG. 12A, there may still be intermediate runs of bad patterns after selecting the best scrambler. Another coding step can be introduced to reduce the bad pattern statistics when interleaved non return to zero inverted (INRZI) coding is used. Scrambled user data 200 is divided into 0 data segments 204-1, 204-2, . . . 204-Q of equal and/or nominally equal sizes. If the total number of 1's in each segment 204 is less than half of the segment size as determined by 1's counters 208-1, 208-2, . . . , 208-Q, all of bits in the segment are inverted by inverters 212-1, 212-2, . . . , 212-Q. When inversion should occur, the counters 208 generate a MUX select control signal to switch multiplexers 216-1, 216-2, . . . , 216-Q between the inverted and non-inverted segments. An inverted segment indicator 217 appends inverted and non-inverted bits of overhead data 218 to modified scrambled user data 220. The 0-bits are used to indicate the inverted segments. While a parallel implementation is shown in FIG. 12A, a serial implementation that is shown in FIG. 12B can also be used.

Figure 13:
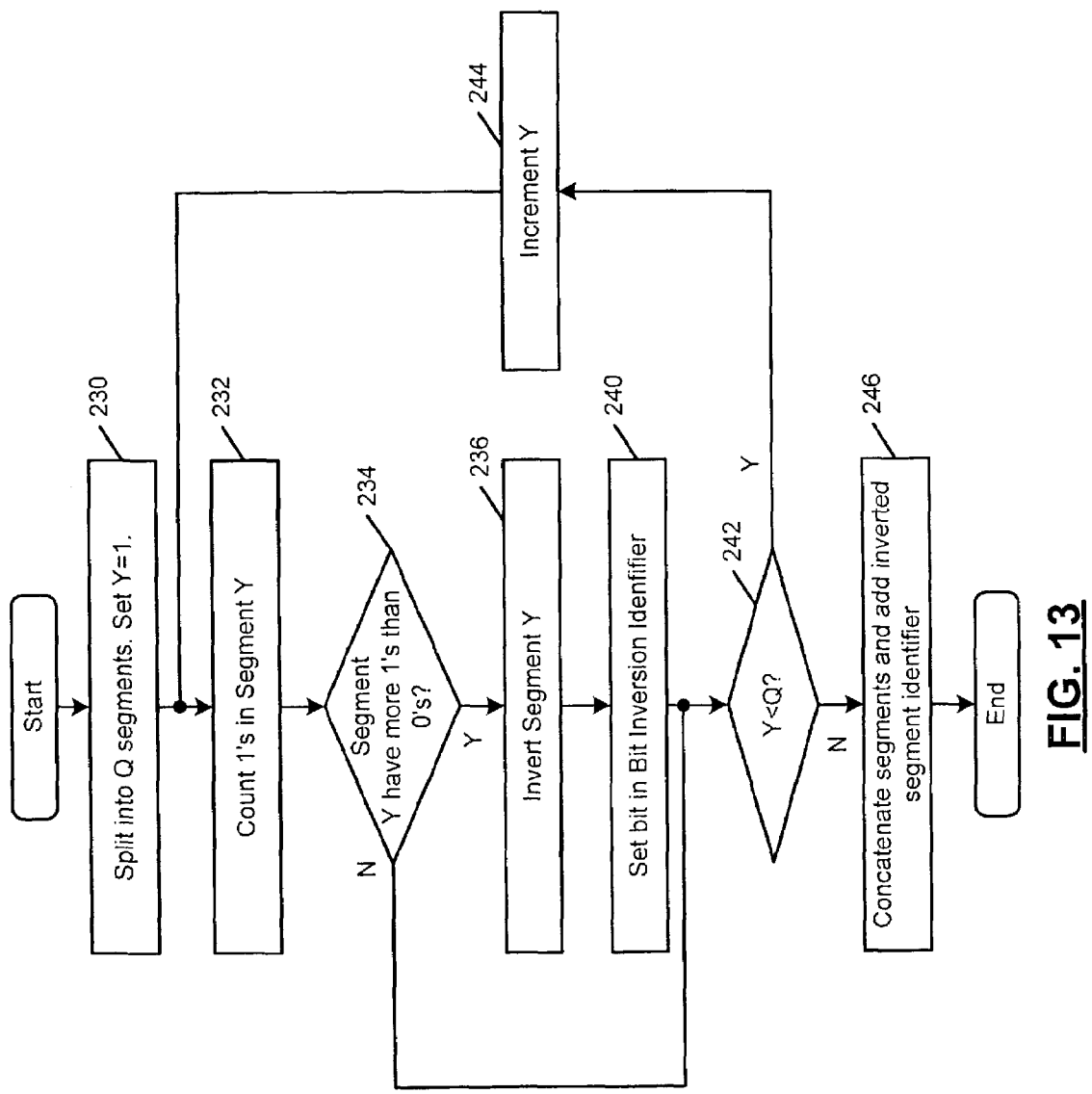
FIG. 13 illustrates steps that are performed by the devices in FIGS. 12A and 12B.

Referring now to FIG. 13, steps for generating the modified scrambled user data are shown. In step 230, the scrambled user data is split into Q segments and a counter Y is set equal to 1. In step 232, the 1's in segment indentified by Y are counted. If there are more 1's than 0's as determined in step 234, the segment is inverted in step 236 and a bit is set in a bit inversion identifier in step 240. If Y<Q as determinded in step 242, Y is incremented in step 244. Otherwise, the inverted segments identifier is appended to the modified scrambled use data 220 in step 246.

Figure 14:
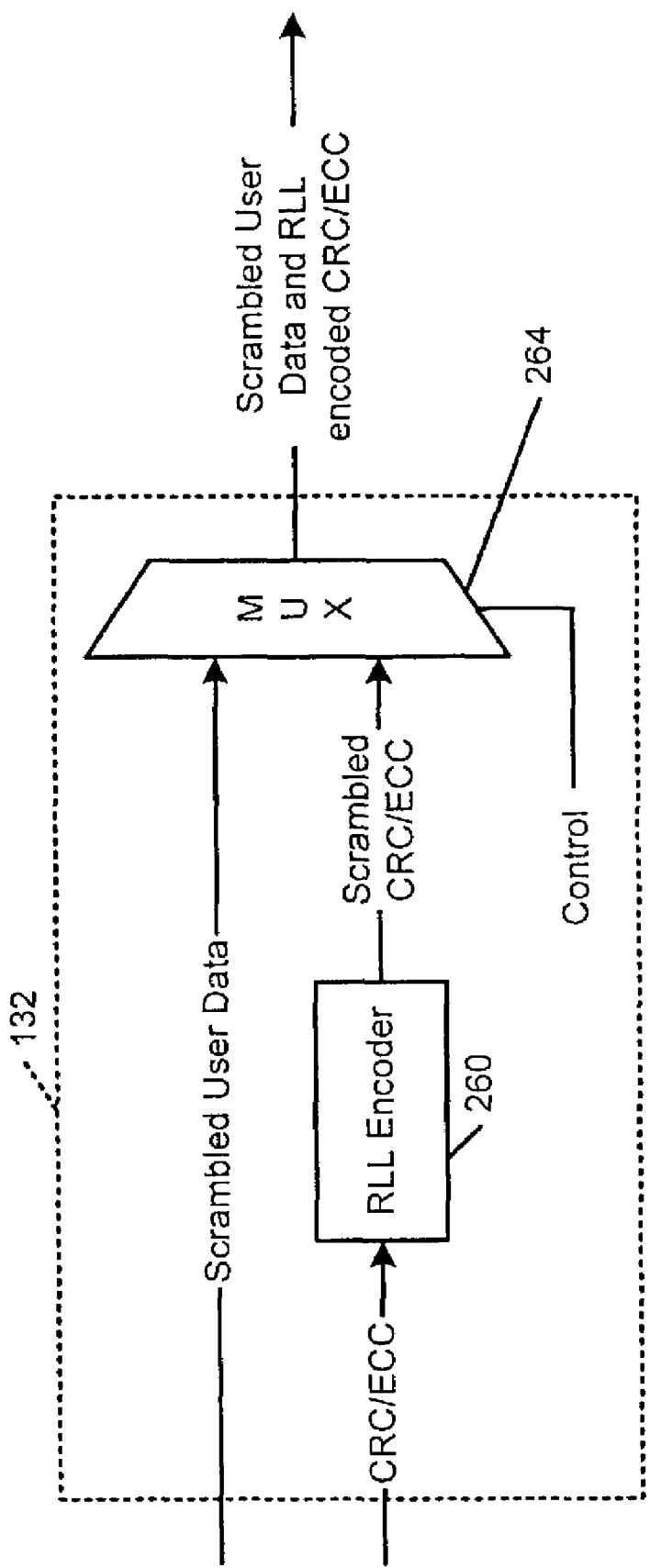
FIG. 14 is a functional block diagram of an exemplary pattern eliminator.

The CRC and ECC symbols that are appended by the ECC ENC to the user data may still have unwanted bit patterns after coding using the embodiments described above. The pattern eliminator 132 is inserted after the ECC ENC to solve this problem. In one embodiment shown in FIG. 14, the pattern eliminator 132 includes a RLL ENC 260. A multiplexer 264 joins the scrambled user data and the RLL-encoded CRC/ECC bits. RLL coding is not performed on the user data portion. In this case, the RLL coding on the CRC/ECC portion of data will consume some capacity. However, the consumption of the data storage capacity is much smaller since the length of the CRC/ECC portion is a relatively small as compared to the length of the user data. Therefore, the use of the RLL coding has a minimal impact.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A communications channel that removes unwanted bit patterns from user data, comprising:
   a buffer that receives that user data that includes a plurality of m-bit symbols;
   a data dependent scrambler that communicates with said buffer, that searches for a first m-bit symbol that is non-zero and that is at least one of different than said plurality of m-bit symbols in the user data and different than inverses of said plurality of m-bit symbols in the user data, wherein said first m-bit symbol is a seed of a scrambling sequence, and wherein said data dependent scrambler generates said scrambling sequence by repeating said seed; and
   a scrambling device that communicates with said data dependent scrambler and that scrambles the user data stored in said buffer using said selected scrambling sequence.

2. The communicates channel of claim 1 wherein said communicates channel is implemented in a data storage system.

3. The communications channel of claim 1 further comprising an error correction coding (ECC) encoder that generates ECC and CRC bits based on said scrambled user data and said seed and that appends said ECC and CRC bits to said scrambled user data.

4. The communications channel of claim 3 further comprising a pattern eliminator that communicates with said ECC encoder and that eliminates unwanted bit patterns in at least one of said scrambled user data and said ECC and CRC bits.

5. The communications channel of claim 4 wherein said pattern eliminator includes a RLL encoder that encodes said ECC and said CRC bits.

6. The communications channel of claim 1 wherein said scrambling device performs bitwise XOR.

7. The communications channel of claim 1 further comprising a first coding device that receives said scrambled user data from said scrambling device and that includes:
   a segmenter that segments said scrambled user data into Q segments;
   a counter that communicates with said segmenter and that counts a number of ones in each of said Q segments; and
   an inverter that communicates with said counter and that inverts said segment if said number of ones in said segment is less than a predetermined number of ones and that does not invert said segment if said number of ones is greater than or equal to said predetermined number of ones; and
   an inverted segment indicator that communicates with said inverter that appends inverted segment data to said segments.

8. The communications channel of claim 1 wherein said communications channel is implemented in a data storage system including a write path and a read path and further comprising a second coding device that is located in said write path and that removes runs of zeros in interleaved subsequences in said scrambled user data.

9. The communications channel of claim 8 wherein said second coding device includes:
   a first divider that separates said scrambled user data into at least one group including first and second symbols each with first and second interleaved subsequences; and
   a symbol interleaver that communicates with said first divider and that interleaves said first and second symbols when at least one of said first interleaved subsequences of said first and second symbols are all zeros and said second interleaved subsequences of said first and second symbols are all zeros.

10. The communications channel of claim 9 further comprising a first decoder that is located in said read path and that includes:
   a second divider that separates said scrambled user data into at least one group including first and second symbols; and a symbol deinterleaver that communicates with said second divider and that deinterleaves said first and second symbols of said group when at least one of first and second symbols are all zeros.

11. The communications channel of claim 10 further comprising a third coding device on said write path that determines when one of said first and second symbols after interleaving is all zeros and the other of said first and second symbols is not all ones and that replaces said all-zero symbol with an all-one symbol.

12. The communications channel of claim 11 further comprising a second decoding device on said read path that determines when one of said first and second symbols is all ones and the other of said first and second symbols is not all zeros and that replaces said all-one symbol with an all-zero symbol and then performs bit deinterleaving.

13. A communications channel that removes unwanted bit patterns from user data, comprising:
   a buffer that receives the user data;
   a data dependent scrambler that communicates with said buffer and that at least one of selects one of a plurality of scrambling sequences based on the user data stored in said buffer and generates a scrambling sequence based on the user data stored in said buffer; and
   a scrambling device that communicates with said data dependent scrambler and that scrambles the user data stored in said buffer with said selected scrambling sequence from said data dependent scrambler,
   wherein the user data includes a plurality of m-bit symbols and wherein said data dependent scrambler searches for a first m-bit symbol that is non-zero and that is at least one of different than said plurality of m-bit words in the user data and different than inverses of said plurality of m-bit words in the user data, and wherein said first m-bit symbol is a seed.

14. The communications channel of claim 13 wherein said communications channel is implemented in a data storage system.

15. The communications channel of claim 13 further comprising an error correction coding (ECC) encoder that generates ECC and CRC bits based on said scrambled user data and that appends said ECC and CRC bits to said scrambled user data.

16. The communications channel of claim 15 further comprising a pattern eliminator that communicates with said ECC encoder and that eliminates unwanted bit patterns in at least one of said scrambled user data and said ECC and CRC bits.

17. The communications channel of claim 16 wherein said pattern eliminator includes a RLL encoder that encodes at least one of said ECC and said CRC bits.

18. The communications channel of claim 13 wherein said scrambling device performs bitwise XOR.

19. The communications channel of claim 13 wherein said communications channel is implemented in a data storage system including a write path and a read path and further comprising a second coding device that is located in said write path and that removes runs of zeros in interleaved subsequences in said scrambled user data.

20. A communications channel that removes unwanted bit patterns from user data, comprising:
   a buffer that receives the user data;
   a data dependent scrambler that communicates with said buffer and that at least one of selects one of a plurality of scrambling sequences based on the user data stored in said buffer and generates a scrambling sequence based on the user data stored in said buffer; and
   a scrambling device that communicates with said data dependent scrambler and that scrambles the user data stored in said buffer with said selected scrambling sequence from said data dependent scrambler,
   wherein said data dependent scrambled includes:
   a plurality of scramblers that receive the user data and that generate scrambled user data sequences;
   a plurality of pattern analyzers that receive corresponding ones of said scrambled user data sequences from said scramblers, that analyze said corresponding ones of said scrambled user data sequences for unwanted bit patterns and that generate unwanted bit pattern weights; and
   a scrambler selector that communicates with said pattern analyzers and that selects one of said scramblers based on said unwanted bit pattern weights.

21. The communications channel of claim 20 wherein the user data includes a plurality of m-bit symbols and wherein said data dependent scrambler searches for a first m-bit symbol that is non-zero and that is at least one of different than said plurality of m-bit words in the user data and different than inverses of said plurality of m-bit words in the user data, and wherein said first m-bit symbol is a seed.

22. The communications channel of claim 21 wherein said data dependent scrambler generates a scrambling sequence by repeating said seed.

23. A communications channel that removes unwanted bit patterns from user data, comprising:
   a buffer that receives the user data;
   a data dependent scrambler that communicates with said buffer and that at least one of selects one of a plurality of scrambling sequences based on the user data stored in said buffer and generates a scrambling sequence based on the user data stored in said buffer; and
   a scrambling device that communicates with said data dependent scrambler and that scrambles the user data stored in said buffer with said selected scrambling sequence from said data dependent scrambler,
   wherein said data dependent scrambler includes:
   a plurality of scramblers that receive the user data and that generate M scrambled user data sequences using a polynomial and a seed;
   a plurality of pattern analyzers that receive corresponding ones of said scrambled user data sequences from said scramblers, that analyze said corresponding ones of said scrambled user data sequences for unwanted bit patterns and that generate unwanted bit pattern weights;
   a backup scrambler that searches for a first m-bit symbol that is non-zero and that is at least one of different than said plurality of m-bit symbols in the user data and different than inverses of said plurality of m-bit symbols, wherein said first m-bit symbol is a seed of said scrambling sequence and wherein said backup scrambler generates a scrambling sequence by repeating said seed; and
   a scrambler selector that communicates with said pattern analyzers and said backup scrambler and that selects one of said plurality of scramblers based on said unwanted bit pattern weights if a lowest one of said unwanted bit pattern weights is less than a predetermined threshold and that selects said backup scrambler if said lowest one of said unwanted bit pattern weights is greater than a predetermined threshold.

24. A communications channel that removes unwanted bit patterns from user data, comprising:
- a buffer that receives the user data;
- a data dependent scrambler that communicates with said buffer and that at least one of selects one of a plurality of scrambling sequences based on the user data stored in said buffer and generates a scrambling sequence based on the user data stored in said buffer;
- a scrambling device that communicates with said data dependent scrambler and that scrambles the user data stored in said buffer with said selected scrambling sequence from said data dependent scrambler; and
- a first coding device that receives said scrambled user data from said scrambling device and that includes:
  - a segmenter that segments said scrambled user data into Q segments;
  - a counter that communicates with said segmenter and that counts a number of ones in each of said Q segments;
  - an inverter that communicates with said counter and that inverts said segment if said number of ones in said segment is less than a predetermined number of ones and that does not invert said segment if said number of ones is greater than or equal to said predetermined number of ones; and
  - an inverted segment indicator that communicates with said inverter and that appends an inverted segment data to said segments.

25. A communications channel that removes unwanted bit patterns from user data, comprising:
- a buffer that receives the user data;
- a data dependent scrambler that communicates with said buffer and that at least one of selects one of a plurality of scrambling sequences based on the user data stored in said buffer and generates a scrambling sequence based on the user data stored in said buffer; and
- a scrambling device that communicates with said data dependent scrambler and that scrambles the user data stored in said buffer with said selected scrambling sequence from said data dependent scrambler;
- wherein said communications channel is implemented in a data storage system including a write path and a read path and further comprising a second coding device that is located in said write path and that removes runs of zeros in interleaved subsequences in said scrambled user data,
- wherein said second coding device includes:
  - a first divider that separates said scrambled user data into at least one group including first and second symbols each with first and second interleaved subsequences; and
  - a symbol interleaver that communicates with said first divider and that interleaves said first and second symbols when at least one of said first interleaved subsequences of said first and second symbols are all zeros and said second interleaved subsequences of said first and second symbols are all zeros.

26. The communications channel of claim 25 further comprising a first decoder that is located in said read path and that includes:
- a second divider that separates said scrambled user data into at least one group including first and second symbols; and
- a symbol deinterleaver that communicates with said second divider and that deinterleaves said first and second symbols of said group when at least one of first and second symbols are all zeros.

27. The communications channel of claim 26 further comprising a third coding device on said write path that determines when one of said first and second symbols after interleaving is all zeros and the other of said first and second symbols is not all ones and that replaces said one of said first and second symbols with an all one symbol.

28. The communications channel of claim 27 further comprising a second decoding device on said read path that determines when one of said first and second symbols is all ones and the other of said first and second symbols is not all zeros and that replaces said one of said first and second symbols with all zeros and then performs bit deinterleaving.

29. A communications channel that removes unwanted bit patterns from user data, comprising:
- buffer means for receiving the user data that includes a plurality of m-bit symbols;
- data dependent scrambling means that communicates with said buffer means, for searching for a first m-bit symbol that is non-zero and that is at least one of different than said plurality of m-bit symbols in the user data and different than inverses of said plurality of m-bit symbols in the user data, wherein said first m-bit symbol is a seed of a scrambling sequence, and wherein said data dependent scrambling means generates said scrambling sequence by repeating said seed; and
- scrambler means that communicates with said data dependent scrambling means for scrambling the user data stored in said buffer means using said selected scrambling sequence.

30. The communications channel of claim 29 wherein said communications channel is implemented in a data storage system.

31. The communications channel of claim 29 further comprising error correction coding (ECC) encoding means for generating ECC and CRC bits based on said scrambled user data and said seed and for appending said ECC and CRC bits to said scrambled user data.

32. The communications channel of claim 31 further comprising pattern eliminating means that communicates with said ECC encoding means for eliminating unwanted bit patterns in at least one of said scrambled user data and said ECC and CRC bits.

33. The communications channel of claim 32 wherein said pattern eliminating means employs a RLL code to encode said ECC and said CRC bits.

34. The communications channel of claim 29 wherein said scrambler means performs bitwise XOR.

35. The communications channel of claim 29 further comprising first coding means for receiving said scrambled user data from said scrambler means and that includes:
- segmenting means for segmenting said scrambled user data into Q segments;
- counting means that communicates with said segmenting means for counting a number of ones in each of said Q segments; and
- inverting means that communicates with said counter for inverting said segment if said number of ones in said segment is less than a predetermined number of ones and for not inverting said segment if said number of ones is greater than or equal to said predetermined number of ones; and
- inverted segment indicating means that communicates with said inverting means for appending inverted segment data to said segments.

36. The communications channel of claim 29 wherein said communications channel is implemented in a data storage system including a write path and a read path and further comprising second coding means that is located in said write path for removing runs of zeros in interleaved subsequences in said scrambled user data.

37. The communications channel of claim 36 wherein said second coding means includes:
   first dividing means for separating said scrambled user data into at least one group including first and second symbols each with first and second interleaved subsequences; and
   symbol interleaving means that communicates with said first dividing means for interleaving said first and second symbols when at least one of said first interleaved subsequences of said first and second symbols are all zeros and said second interleaved subsequences of said first and second symbols are all zeros.

38. The communications channel of claim 37 further comprising first decoding means for decoding signals in said read path and that includes:
   second dividing means for separating said scrambled user data into at least one group including first and second symbols; and
   symbol deinterleaving means that communicates with said second divider for deinterleaving said first and second symbols of said group when at least one of first and second symbols are all zeros.

39. The communications channel of claim 38 further comprising third coding means on said write path for determining when one of said first and second symbols after interleaving is all zeros and the other of said first and second symbols is not all ones and for replacing said all-zero symbol with an all-one symbol.

40. The communications channel of claim 39 further comprising second decoding means on said read path for determining when one of said first and second symbols is all ones and the other of said first and second symbols is not all zeros and for replacing said all-one symbol with an all-zero symbol and for performing bit deinterleaving.

41. A communications channel that removes unwanted bit patterns from user data, comprising:
   buffer means for storing the user data;
   data dependent scrambling means that communicates with said buffer means for at least one of selecting one of a plurality of scrambling sequences based on the user data stored in said buffer means and generating a scrambling sequence based on the user data stored in said buffer means; and
   scrambler means that communicates with said data dependent scrambling means for scrambling the user data stored in said buffer means with said selected scrambling sequence from said data dependent scrambling means,
   wherein the user data includes a plurality of m-bit symbols and wherein said data dependent scrambling means searches for a first m-bit symbol that is non-zero and that is at least one of different than said plurality of m-bit words in the user data and different than inverses of said plurality of m-bit words in the user data, and wherein said first m-bit symbol is a seed.

42. The communications channel of claim 41 wherein said communications channel is implemented in a data storage system.

43. The communications channel of claim 41 further comprising error correction coding (ECC) encoding means for generating ECC and CRC bits based on said scrambled user data and for appending said ECC and CRC bits to said scrambled user data.

44. The communications channel of claim 43 further comprising pattern eliminating means that communicates with said ECC encoding means for eliminating unwanted bit patterns in at least one of said scrambled user data and said ECC and CRC bits.

45. The communications channel of claim 44 wherein said pattern eliminating means uses a RLL code to encode at least one of said ECC and said CRC bits.

46. The communications channel of claim 41 wherein said scrambler means performs bitwise XOR.

47. The communications channel of claim 41 wherein said communications channel is implemented in a data storage system including a write path and a read path and further comprising second coding means that is located in said 48. A communications channel that removes unwanted bit patterns from user data, comprising:
   buffer means for storing the user data;
   data dependent scrambling means that communicates with said buffer means for at least one of selecting one of a plurality of scrambling sequences based on the user data stored in said buffer means and generating a scrambling sequence based on the user data stored in said buffer means; and
   scrambler means that communicates with said data dependent scrambling means for scrambling the user data stored in said buffer means with said selected scrambling sequence from said data dependent scrambling means,
   wherein said data dependent scrambler includes:
      a plurality of scrambling means for receiving the user data and for generating scrambled user data sequences;
      a plurality of pattern analyzing means for receiving corresponding ones of said scrambled user data sequences from said scrambling means, for analyzing said corresponding ones of said scrambled user data sequences for unwanted bit patterns, and for generating unwanted bit pattern weights; and
      scrambling means selector that communicates with said pattern analyzers for selecting one of said scrambling means based on said unwanted bit pattern weights.

49. The communications channel of claim 48 wherein the user data includes a plurality of m-bit symbols and wherein said data dependent scrambling means searches for a first m-bit symbol that is non-zero and that is at least one of different than said plurality of m-bit words in the user data and different than inverses of said plurality of m-bit words in the user data, and wherein said first m-bit symbol is a seed.

50. The communications channel of claim 49 wherein said data dependent scrambling means generates a scrambling sequence by repeating said seed.

51. A communications channel that removes unwanted bit patterns from user data, comprising:
   buffer means for storing the user data;
   data dependent scrambling means that communicates with said buffer means for at least one of selecting one of a plurality of scrambling sequences based on the user data stored in said buffer means and generating a scrambling sequence based on the user data stored in said buffer means; and
   scrambler means that communicates with said data dependent scrambling means for scrambling the user data stored in said buffer means with said selected scrambling sequence from said data dependent scrambling means, wherein said data dependent scrambling means includes:
a plurality of scrambling means for receiving the user data and for generating M scrambled user data sequences using a polynomial and a seed;
a plurality of pattern analyzing means for receiving corresponding ones of said scrambled user data sequences from said scrambling means, for analyzing said corresponding ones of said scrambled user data sequences for unwanted bit patterns, and for generating unwanted bit pattern weights;
backup scrambling means for searching for a first m-bit symbol that is non-zero and that is at least one of different than said plurality of m-bit symbols in the user data and different than inverses of said plurality of m-bit symbols, wherein said first m-bit symbol is a seed of said scrambling sequence and wherein said backup scrambling means generates a scrambling sequence by repeating said seed; and
scrambling means selector that communicates with said pattern analyzing means and said backup scrambling means for selecting one of said plurality of scrambling means based on said unwanted bit pattern weights if a lowest one of said unwanted bit pattern weights is less than a predetermined threshold and for selecting said backup scrambling means if said lowest one of said unwanted bit pattern weights is greater than a predetermined threshold.

52. A communications channel that removes unwanted bit patterns from user data, comprising:
buffer means for storing the user data;
data dependent scrambling means that communicates with said buffer means for at least one of selecting one of a plurality of scrambling sequences based on the user data stored in said buffer means and generating a scrambling sequence based on the user data stored in said buffer means;
scrambler means that communicates with said data dependent scrambling means for scrambling the user data stored in said buffer means with said selected scrambling sequence from said data dependent scrambling means;
first coding means for receiving said scrambled user data from said scrambler means and that includes:
segmenting means for segmenting said scrambled user data into Q segments;
counting means that communicates with said segmenting means for counting a number of ones in each of said Q segments;
inverting means that communicates with said counter for inverting said segment if said number of ones in said segment is less than a predetermined number of ones and for not inverting said segment if said number of ones is greater than or equal to said predetermined number of ones; and
inverted segment indicating means that communicates with said inverter for appending inverted segment data to said segments.

53. A communications channel that removes unwanted bit patterns from user data, comprising:
buffer means for storing the user data;
data dependent scrambling means that communicates with said buffer means for at least one of selecting one of a plurality of scrambling sequences based on the user data stored in said buffer means and generating a scrambling sequence based on the user data stored in said buffer means; and scrambler means that communicates with said data dependent scrambling means for scrambling the user data stored in said buffer means with said selected scrambling sequence from said data dependent scrambling means
wherein said communications channel is implemented in a data storage system including a write path and a read path and further comprising second coding means that is located in said write path for removing runs of zeros in interleaved subsequences in said scrambled user data,
wherein said second coding means includes:
first dividing means for separating said scrambled user data into at least one group including first and second symbols each with first and second interleaved subsequences; and
symbol interleaving means that communicates with said first divider for interleaving said first and second symbols when at least one of said first interleaved subsequences of said first and second symbols are all zeros and said second interleaved subsequences of said first and second symbols are all zeros.

54. The communications channel of claim 53 further comprising first decoding means that is located in said read path and that includes:
second dividing means for separating said scrambled user data into at least one group including first and second symbols; and
symbol deinterleaving means that communicates with said second divider for deinterleaving said first and second symbols of said group when at least one of first and second symbols are all zeros.

55. The communications channel of claim 54 further comprising third coding means on said write path for determining when one of said first and second symbols after interleaving is all zeros and the other of said first and second symbols is not all ones and for replacing said one of said first and second symbols with an all one symbol.

56. The communications channel of claim 55 further comprising second decoding means on said read path that determines when one of said first and second symbols is all ones and the other of said first and second symbols is not all zeros and for replacing said one of said first and second symbols with all zeros and then for performing bit deinterleaving.

57. A method for operating a communications channel that removes unwanted bit patterns from user data, comprising:
storing the user data that includes a plurality of m-bit symbols;
searching for a first m-bit symbol that is non-zero and that is at least one of different than said plurality of m-bit symbols in the user data and different than inverses of said plurality of m-bit symbols in the user data, wherein said first m-bit symbol is a seed of a scrambling sequence;
generating said scrambling sequence by repeating said seed; and
scrambling the stored user data using said selected scrambling sequence.

58. The method of claim 57 wherein said communications channel is implemented in a data storage system.

59. The method of claim 57 further comprising:
generating ECC and CRC bits based on said scrambled user data and said seed; and
appending said ECC and CRC bits to said scrambled user data.

60. The method of claim 59 further comprising eliminating unwanted bit patterns in said ECC and CRC bits.

61. The method of claim 60 wherein said step of eliminating patterns includes encoding said ECC and said CRC bits using a RLL code.

62. The method of claim 57 wherein said step of scrambling the user data includes performing bitwise XOR.

63. The method of claim 57 further comprising:
segmenting said scrambled user data into Q segments;
counting a number of ones in each of said Q segments;
inverting said segment if said number of ones in said segment is less than a predetermined number of ones and not inverting said segment if said number of ones is greater than or equal to said predetermined number of ones; and
appending inverted segment data to said segments.

64. The method of claim 57 wherein said communications channel is implemented in a data storage system including a write path and a read path and further comprising removing runs of zeros in interleaved subsequences in said scrambled user data.

65. The method of claim 64 wherein said step of removing runs of zeros in interleaved subsequences includes:
separating said scrambled user data into at least one group including first and second symbols each with first and second interleaved subsequences; and
interleaving said first and second symbols when at least one of said first interleaved subsequences of said first and second symbols are all zeros and said second interleaved subsequences of said first and second symbols are all zeros.

66. The method of claim 65 further comprising:
decoding signals in said read path;
separating said scrambled user data into at least one group including first and second symbols; and
deinterleaving said first and second symbols of said group when at least one of first and second symbols are all zeros.

67. The method of claim 66 further comprising:
determining when one of said first and second symbols after interleaving is all zeros and the other of said first and second symbols is not all ones; and
replacing said all-zero symbol with an all-one symbol.

68. The method of claim 67 further comprising:
determining when one of said first and second symbols on said read path is all ones and the other of said first and second symbols is not all zeros; and
replacing said all-one symbol with an all-zero symbol and for performing bit deinterleaving.

69. A method of operating a communications channel that removes unwanted bit patterns from user data, comprising:
storing the user data;
at least one of selecting one of a plurality of scrambling sequences based on the stored user data and generating a scrambling sequence based on the stored user data;
scrambling the user data with said selected scrambling sequence, wherein the user data includes a plurality of m-bit symbols: and
searching for a first m-bit symbol that is non-zero and that is at least one of different than said plurality of m-bit words in the user data and different than inverses of said plurality of m-bit words in the user data, and wherein said first m-bit symbol is a seed.

70. The method of claim 69 wherein said communications channel is a data storage system.

71. The method of claim 69 further comprising:
generating ECC and CRC bits based on said scrambled user data; and
appending said ECC and CRC bits to said scrambled user data.

72. The method of claim 71 further comprising eliminating unwanted bit patterns in said ECC and CRC bits.

73. The method of claim 72 wherein said step of eliminating patterns includes using a RLL code to encode said ECC and said CRC bits.

74. The method of claim 69 wherein said step of scrambling includes bitwise XOR.

75. The method of claim 69 wherein said communications channel is implemented in a data storage system including a write path and a read path and further comprising removing runs of zeros in interleaved subsequences in said scrambled user data.

76. A method of operating a communications channel that removes unwanted bit patterns from user data, comprising:
storing the user data;
at least one of selecting one of a plurality of scrambling sequences based on the stored user data and generating a scrambling sequence based on the stored user data;
scrambling the user data with said selected scrambling sequence;
providing a plurality of scramblers that receive the user data and that generate scrambled user data sequences;
receiving corresponding ones of said scrambled user data sequences from said scramblers;
analyzing said corresponding ones of said scrambled user data sequences for unwanted bit patterns;
generating unwanted bit pattern weights; and
selecting one of said scramblers based on said unwanted bit pattern weights.

77. The method of claim 76 wherein the user data includes a plurality of m-bit symbols and further comprising searching for a first m-bit symbol that is non-zero and that is at least one of different than said plurality of m-bit words in the user data and different than inverses of said plurality of m-bit words in the user data, and wherein said first m-bit symbol is a seed.

78. The method of claim 77 further comprising generating a scrambling sequence by repeating said seed.

79. A method of operating a communications channel that removes unwanted bit patterns from user data, comprising:
storing the user data;
at least one of selecting one of a plurality of scrambling sequences based on the stored user data and generating a scrambling sequence based on the stored user data;
scrambling the user data with said selected scrambling sequence;
providing a plurality of scramblers that receive the user data and generate M scrambled user data sequences using a polynomial and a seed;
receiving corresponding ones of said scrambled user data sequences from said scramblers;
analyzing said corresponding ones of said scrambled user data sequences for unwanted bit patterns;
generating unwanted bit pattern weights;
providing a backup scrambler that searches for a first m-bit symbol that is non-zero and that is at least one of different than said plurality of m-bit symbols in the user data and different than inverses of said plurality of m-bit symbols, wherein said first m-bit symbol is a seed of said scrambling sequence;
generating a scrambling sequence by repeating said seed; and selecting one of said plurality of scramblers based on said unwanted bit pattern weights if a lowest one of said unwanted bit pattern weights is less than a predetermined threshold and selecting said backup scrambler if said lowest one of said unwanted bit pattern weights is greater than a predetermined threshold.

80. A method of operating a communications channel that removes unwanted bit patterns from user data, comprising:
  storing the user data;
  at least one of selecting one of a plurality of scrambling sequences based on the stored user data and generating a scrambling sequence based on the stored user data;
  scrambling the user data with said selected scrambling sequence;
  receiving said scrambled user data;
  segmenting said scrambled user data into Q segments;
  counting a number of ones in each of said Q segments;
  inverting said segment if said number of ones in said segment is less than a predetermined number of ones and not inverting said segment if said number of ones is greater than or equal to said predetermined number of ones; and
  appending inverted segment data to said segments.

81. A method of operating a communications channel that removes unwanted bit patterns from user data, comprising:
  storing the user data;
  at least one of selecting one of a plurality of scrambling sequences based on the stored user data and generating a scrambling sequence based on the stored user data;
  scrambling the user data with said selected scrambling sequence, wherein said communications channel is implemented in a data storage system including a write path and a read path and further comprising removing runs of zeros in interleaved subsequences in said scrambled user data;
  separating said scrambled user data in said write path into at least one group including first and second symbols each with first and second interleaved subsequences; and
  interleaving said first and second symbols when at least one of said first interleaved subsequences of said first and second symbols all zeros and said second interleaved subsequences of said first and second symbols are all zeros.

82. The method of claim 81 further comprising:
  separating said scrambled user data in said read path into at least one group including first and second symbols; and
  deinterleaving said first and second symbols of said group when at least one of first and second symbols are all zeros.

83. The method of claim 82 further comprising:
  determining when one of said first and second symbols in said write path after interleaving is all zeros and the other of said first and second symbols is not all ones; and
  replacing said one of said first and second symbols with an all one symbol.

84. The method of claim 83 further comprising:
  determining when one of said first and second symbols on said read path is all ones and the other of said first and second symbols is not all zeros; and
  replacing said one of said first and second symbols with all zeros; and
  performing bit deinterleaving.

* * * * *

UNITED STATES PATENT AND TRADEMARK OFFICE
CERTIFICATE OF CORRECTION

| | | |
|---|---|---|
| PATENT NO. | : 7,269,778 B1 | Page 1 of 1 |
| APPLICATION NO. | : 10/423552 | |
| DATED | : September 11, 2007 | |
| INVENTOR(S) | : Weishi Feng et al. | |

It is certified that error appears in the above-identified patent and that said Letters Patent is hereby corrected as shown below:

| | |
|---|---|
| Title Page, ITEM (56) | Under References Cited, insert -- EP 0926671 A1 6/1999 Europe -- |
| Title Page, Line 6, (57) | In the Abstract, insert -- on -- after "based" |
| Column 4, Line 54 | Delete "$(2^{m-1} - k)$" and insert -- $(2^m - 1 - k)$ -- |
| Column 5, Line 12 | Delete "that" and insert -- than -- |
| Column 5, Line 36 | Delete "$b_8$" and insert -- $b_9$ -- |
| Column 5, Line 56 | Delete "at" after "shown" |
| Column 7, Line 37 | Delete "scamblers" and insert -- scramblers -- |
| Column 8, Line 25 | Delete "conduction" and insert -- conjunction -- |
| Column 8, Line 49 | After "user data and" insert -- CRC/ECC portions. According to one embodiment of the present invention, the -- |
| Column 9, Line 11 | Delete "O" and insert -- Q -- |
| Column 9, Line 21 | Delete "O" and insert -- Q -- |
| Column 9, Line 46 | Delete "a" after "portion is" |
| Column 10, Line 8 | Delete "communicates" and insert -- communications -- |
| Column 10, Line 9 | Delete "communicates" and insert -- communications -- |
| Column 12, Line 5 | Delete "scrambled" and insert -- scrambler -- |
| Column 16, Line 14 | After "located in said" insert -- write path for removing runs of zeros in interleaved subsequences in said scrambled user date. -- |

Signed and Sealed this

Eighteenth Day of December, 2007

JON W. DUDAS
*Director of the United States Patent and Trademark Office*